United States Patent
Yonezawa

(10) Patent No.: US 7,812,568 B2
(45) Date of Patent: Oct. 12, 2010

(54) VOLTAGE DETECTING CIRCUIT

(75) Inventor: Yoshiaki Yonezawa, Gunma-ken (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 544 days.

(21) Appl. No.: 11/952,059

(22) Filed: Dec. 6, 2007

(65) Prior Publication Data

US 2008/0150516 A1 Jun. 26, 2008

(30) Foreign Application Priority Data

Dec. 7, 2006 (JP) .............................. 2006-330783
Mar. 19, 2007 (JP) .............................. 2007-070834

(51) Int. Cl.
*H02J 7/00* (2006.01)
*G01N 27/416* (2006.01)

(52) U.S. Cl. ....................... 320/116; 320/121; 320/166; 324/426; 324/434

(58) Field of Classification Search .................. 320/116
See application file for complete search history.

(56) References Cited

U.S. PATENT DOCUMENTS 6,288,710 B1 * 9/2001 Lee et al. ..................... 345/173
6,803,766 B2 * 10/2004 Kobayashi et al. ........... 324/434
2002/0017895 A1 * 2/2002 Kawashima ................. 320/118
2006/0132139 A1 * 6/2006 Ohta et al. ................... 324/426
2006/0192529 A1 * 8/2006 Kimura et al. ............... 320/116
2007/0285054 A1 * 12/2007 Li et al. ....................... 320/116

FOREIGN PATENT DOCUMENTS

JP      2002-243771     8/2002

* cited by examiner

*Primary Examiner*—Edward Tso
*Assistant Examiner*—M'Baye Diao
(74) *Attorney, Agent, or Firm*—SoCal IP Law Group LLP; Steven C. Sereboff; John E. Gunther

(57) ABSTRACT

A voltage detecting circuit comprises: an operational amplifier whose one input terminal is applied with a first reference voltage; a first capacitor whose one end is connected to the other input terminal of the operational amplifier; a second capacitor whose one end is connected to an output terminal of the operational amplifier, and whose other end is connected to the other input terminal of the operational amplifier; a switch circuit for applying a first voltage and a second voltage sequentially to the other end of the first capacitor; and a discharging circuit for discharging the second capacitor before the second voltage is applied to the other end of the first capacitor, a difference between the first voltage and the second voltage being detected based on a voltage at the output terminal of the operational amplifier after the second voltage is applied to the other end of the first capacitor.

15 Claims, 16 Drawing Sheets

VOLTAGE DETECTING CIRCUIT

CROSS-REFERENCE TO RELATED APPLICATIONS

This application claims the benefit of priority to Japanese Patent Application Nos. 2006-330783 and 2007-070834, filed Dec. 7, 2006 and Mar. 19, 2007, respectively, of which full contents are incorporated herein by reference.

BACKGROUND

1. Field of the Invention

The present invention relates to a voltage detecting circuit.

2. Description of the Related Art

In a device using rechargeable batteries, such as a laptop PC, a voltage of each battery must be detected accurately to manage charging/discharging of the batteries that are serially connected. FIG. 18 is a diagram that shows a structure of a common battery voltage detecting circuit (See Japanese Patent Application Laid-Open No. 2002-243771). A battery voltage detecting circuit 100 detects each voltage of four serially-connected batteries, BV1 to BV4. The battery voltage detecting circuit 100 includes an operational amplifier 110, resistors R1 to R4, switches SW0M to SW4M and SW0P to SW3P, and a power source 115 that outputs a reference voltage $V_{REF}$. To detect a voltage $V_{BV4}$ of the battery BV4 using the battery voltage detecting circuit 100, the switches SW4M and SW3P are turned ON, and the other switches are kept OFF. In this manner, a voltage $V_{OUT}$, in proportion to the difference between a voltage V4, a voltage at a positive terminal of the battery BV4, and a voltage V3, a voltage at a negative terminal thereof, is output from the operational amplifier 110 to an AD converter (ADC) 120. The ADC 120 converts the voltage $V_{OUT}$ into a digital value, so as to allow detection of the voltage $V_{BV4}$ of the battery BV4. A voltage $V_{BV3}$ of the battery BV3 can be detected in the similar manner, by turning the switches SW3M and SW2P ON and keeping the other switches OFF. The voltage $V_{BV2}$ of the battery BV2 can be detected by turning the switches SW2M and SW1P ON and keeping the other switches OFF. Also, the voltage $V_{BV1}$ of the battery BV1 can be detected by turning the switches SW1M and SW0P ON and keeping the other switches OFF.

If the batteries BV1 to BV4 are lithium-ion batteries, each of the voltages $V_{BV1}$ to $V_{BV4}$ between both ends of each of the batteries BV1 to BV4 reaches approximately 4.5 volts when the batteries are fully charged. Assuming that each of the voltages $V_{BV1}$ to $V_{BV4}$ of the batteries BV1 to BV4 are 5 volts to give extra allowance for design, the batteries BV1 to BV4, connected serially, can generate a total voltage of 20 volts. Therefore, the battery voltage detecting circuit 100 must be tolerable against a high voltage. On the contrary, the control circuit, including the ADC 120, generally utilizes a power source of approximately 3.3 volts. Therefore, the voltage $V_{OUT}$ output from the battery voltage detecting circuit 100 must be 3.3 volts or less.

Assuming that the resistance of the resistors R3 and R4 are R3 and R4, respectively, a gain $G_{AMP}$ of the operational amplifier 110 can be expressed as R4/R3. Therefore, the output $V_{OUT}$, output to detect the voltage $V_{BV4}$ of the battery BV4, can be expressed as $V_{OUT}=V_{BV4}G_{AMP}+V_{REF}=(V4-V3)R4/R3+V_{REF}$. Then, in order to achieve $V_{OUT} \leq 3.3$ volts when the $V_{BV4}$ is 5 volts and $V_{REF}$ is 0.2 volts, the gain $G_{AMP}$ of the operational amplifier 110 must be $G_{AMP} \leq (V_{OUT}-V_{REF})/V_{BV4}=(3.3-0.2)/5 \approx 0.6$. Based on this calculation, the voltage $V_{OUT}$, output to the ADC 120, can be brought down to 3.3 volts or less by selecting the resistors R3 and R4 so that the $G_{AMP}$ of the operational amplifier 110 becomes approximately 0.6. However, in this arrangement, the operational amplifier 110 also must be tolerable against a high voltage. This could lead to increase the cost of the battery voltage detecting circuit 100.

In order to use an operational amplifier without the tolerance against a high voltage, the voltage applied to the operational amplifier 110 must be 3.3 volts or less. In other words, to reduce a voltage $V^+$ that is applied to the positive input terminal of the operational amplifier 110 to 3.3 volts or less, the following condition must be met: $(V3-V_{REF})R4/(R3+R4)+V_{REF} \leq 3.3$. If this condition is met, $R4/(R3+R4) \leq (3.3-V_{REF})/(V3-V_{REF})=(3.3-0.2)/(15-0.2)=3.1/14.8 \approx 0.21$. This makes the gain $G_{AMP}$ of the operational amplifier 110 to be calculated as $G_{AMP}=R4/R3 \leq 0.21/(1-0.21) \approx 0.26$. Therefore, an operational amplifier 110 without the tolerance against a high voltage can be used by selecting the resistors R3 and R4 so to bring the $G_{AMP}$ of the operational amplifier 110 to approximately 0.26. However, because the gain $G_{AMP}$ of the differential amplifier, which is comprised of the operational amplifier 110, is kept small, the voltage $V_{OUT}$, input to the ADC 120, also becomes low. To detect the battery voltages at high accuracy in this arrangement, the ADC 120 must be highly accurate. This, again, leads to increase the cost.

Furthermore, upon detecting the voltages of the battery BV1 to BV4 with the battery voltage detecting circuit 100, the currents go through the resistors R1 and R3 connected to the input terminals of the operational amplifier 110. Therefore, in order to prevent these currents from discharging the batteries BV1 to BV4, the resistances of the resistors R1 and R3 must be high as a several mega ohms. Furthermore, the resistors R1 to R4 must be less voltage-dependent to allow accurate detection of the voltages of the batteries BV1 to BV4. To manufacture an integrated circuit having resistors with a high resistance and low voltage-dependency, special processes need be implemented. This also leads to increase the cost.

SUMMARY OF THE INVENTION

A voltage detecting circuit according to an aspect of the present invention, comprises: an operational amplifier whose one input terminal is configured to be applied with a first reference voltage; a first capacitor whose one end is connected to the other input terminal of the operational amplifier; a second capacitor whose one end is connected to an output terminal of the operational amplifier, and whose other end is connected to the other input terminal of the operational amplifier; a switch circuit configured to apply a first voltage and a second voltage sequentially to the other end of the first capacitor; and a discharging circuit configured to discharge the second capacitor before the second voltage is applied to the other end of the first capacitor, a difference between the first voltage and the second voltage being detected based on a voltage at the output terminal of the operational amplifier after the second voltage is applied to the other end of the first capacitor.

Other features of the present invention will become apparent from descriptions of this specification and of the accompanying drawings.

DESCRIPTION OF THE DRAWINGS

For more thorough understanding of the present invention and advantages thereof, the following description should be read in conjunction with the accompanying drawings, in which:

FIG. 5 is a diagram that shows currents that flow when switches are turned ON;

DETAILED DESCRIPTION

Description of Apparatus

At least the following details will become apparent from descriptions of this specification and of the accompanying drawings.

FIRST EMBODIMENT

== Circuit Structure ==

Figure 1:
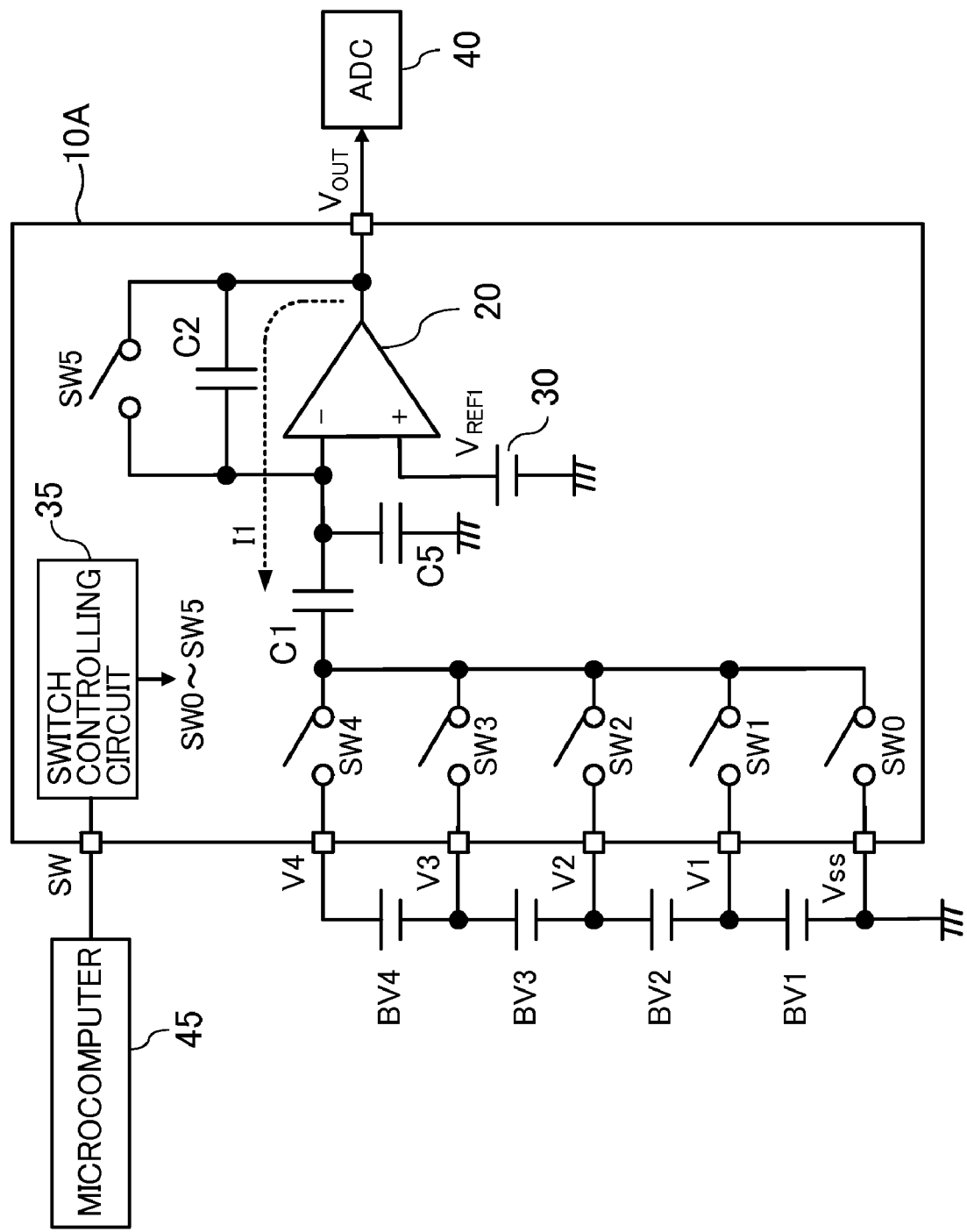
FIG. 1 is a diagram that shows a circuit structure of a battery voltage detecting circuit according to a first embodiment of the present invention.

FIG. 1 is a diagram that shows a circuit structure of a battery voltage detecting circuit according to a first embodiment of the present invention. The battery voltage detecting circuit 10A detects a voltage of each of four serially connected batteries, BV1 to BV4. The battery voltage detecting circuit 10A is an integrated circuit having an operational amplifier 20, capacitors C1, C2, and C5, switches SW0 to SW5, a power source 30, and a switch control circuit 35.

The operational amplifier 20 has a positive input terminal applied with a reference voltage $V_{REF1}$ (a first reference voltage) that is output from the power source 30, and a negative input terminal connected to one end of the capacitor C1. A voltage $V_{OUT}$ output from an output terminal of the operational amplifier 20 is input voltage to an AD converter (ADC) 40. Because the negative input terminal of the operational amplifier 20 is connected to the capacitor C1 and no direct voltage is applied thereto, the operational amplifier 20 does not have to be tolerable against a high voltage.

The capacitor C1 (a first capacitor) has the one end connected to the negative input terminal of the operational amplifier 20, and the other end connected to one ends of the switches SW0 to SW4, respectively. The capacitor C2 (a second capacitor) has one end connected to the output terminal of the operational amplifier 20, and the other end connected to the negative input terminal of the operational amplifier 20. The capacitor C5 (a third capacitor) has one end connected to the negative input terminal of the operational amplifier 20, and the other end grounded.

The switch SW0 has one end connected to the other end of the capacitor C1, and the other end connected to a negative terminal of the battery BV1 via a terminal $V_{SS}$. The switch SW1 has one end connected to the other end of the capacitor C1, and the other end connected to a positive terminal of the battery BV1 and a negative terminal of the battery BV2 via a terminal V1. The switch SW2 has one end connected to the other end of the capacitor C1, and the other end connected to a positive terminal of the battery BV2 and a negative terminal of the battery BV3 via a terminal V2. The switch SW3 has one end connected to the other end of the capacitor C1, and the other end connected to a positive terminal of the battery BV3 and a negative terminal of the battery BV4 via a terminal V3. The switch SW4 has one end connected to the other end of the capacitor C1, and the other end connected to a positive terminal of the battery BV4 via a terminal V4. The switch SW5 has one end connected to the output terminal of the operational amplifier 20, and the other end connected to the negative input terminal of the operational amplifier 20. The switches SW0 to SW4 correspond to a switch circuit of the present invention, and the switch SW5 corresponds to a discharging circuit of the invention.

The power source 30 is a power circuit that outputs the reference voltage $V_{REF}$. According to the first embodiment, it is assumed that $V_{REF}$=0.8 volts.

The switch control circuit 35 controls ON/OFF of the switches SW0 to SW5 based on signals input from a microcomputer 45. The function equivalent to that of the switch control circuit 35 may also be implemented as software.

If lithium-ion batteries are used for the batteries BV1 to BV4, the voltages $V_{BV1}$ to $V_{BV4}$ between both ends of each of the batteries BV1 to BV4 reach approximately 4.5 volts when these batteries are fully charged. Assuming that each of the voltages $V_{BV1}$ to $V_{BV4}$ of the batteries BV1 to BV4 are 5 volts to give extra allowance for design, the batteries BV1 to BV4, connected serially, can generate a total voltage of 20 volts. Therefore, the capacitor C1 must be tolerable against a high voltage. According to the first embodiment, the capacitors C1, C2, and C5 are comprised of wiring capacitances that are generally less voltage-dependent.

Figure 2:
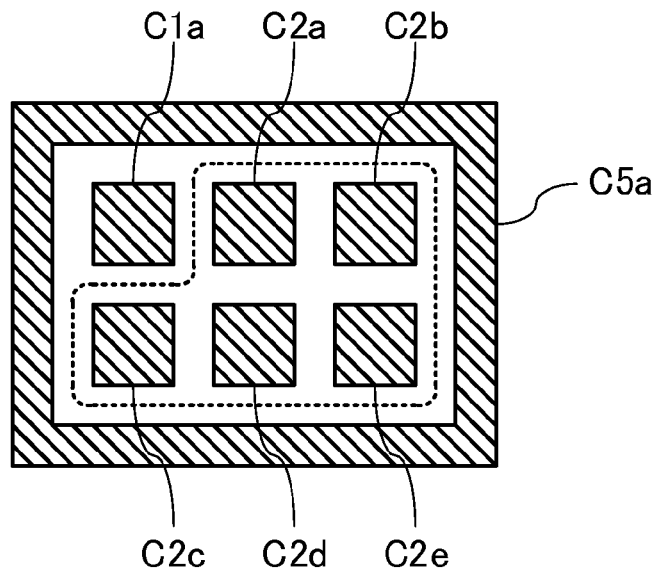
FIG. 2 is a diagram that shows an example of metal wiring arrangement for comprising capacitors by wiring capacitances.

FIG. 2 is a diagram that shows an example of metal wirings that comprise the capacitors C1, C2 and C5 by wiring capacitances. Assuming a capacitance of the capacitor C1 is 2pF and that of the capacitor C2 is 10pF, the metal wirings should be arranged so that the area ratio between an area C1a of the capacitor C1 and areas C2a to C2e of the capacitor C2 is 1 to 5, as shown in FIG. 2. The wiring capacitance cannot achieve a high accuracy unless all four sides of the metal wiring have the same conditions. For example, if metal wiring C5a shown in FIG. 2 is not provided, the metal wiring C1a has another metal wiring in vicinity of the right side and the lower side thereof, but not the left side and the upper side thereof. On the contrary, the metal wiring C2a has another metal wiring in vicinity of each side thereof, except the upper side. Therefore, the metal wiring 5Ca is provided so that all of the four sides of all of the metal wirings have the same conditions. The metal wiring C5a not only acts as a dummy metal (a dummy wiring) to improve the accuracy of capacitances of the capacitors C1 and C2, and but also comprise the capacitor C5.

By providing the metal wiring C5a, which is a dummy metal to make the conditions surrounding the four sides of the metal wirings C1a and C2a to C2e the same, the accuracy of the capacitances of the capacitors C1 and C2 can be improved. The capacitor C5 is actualized by the metal wiring 5Ca, which is the dummy metal to improve the accuracy of the capacitances of the capacitors C1 and C2. In this manner, the dummy metal is utilized effectively. In other words, a chip size of the battery voltage detecting circuit 10A can be reduced because another wiring capacitance is not required to realize the capacitor C5.

Figure 3:
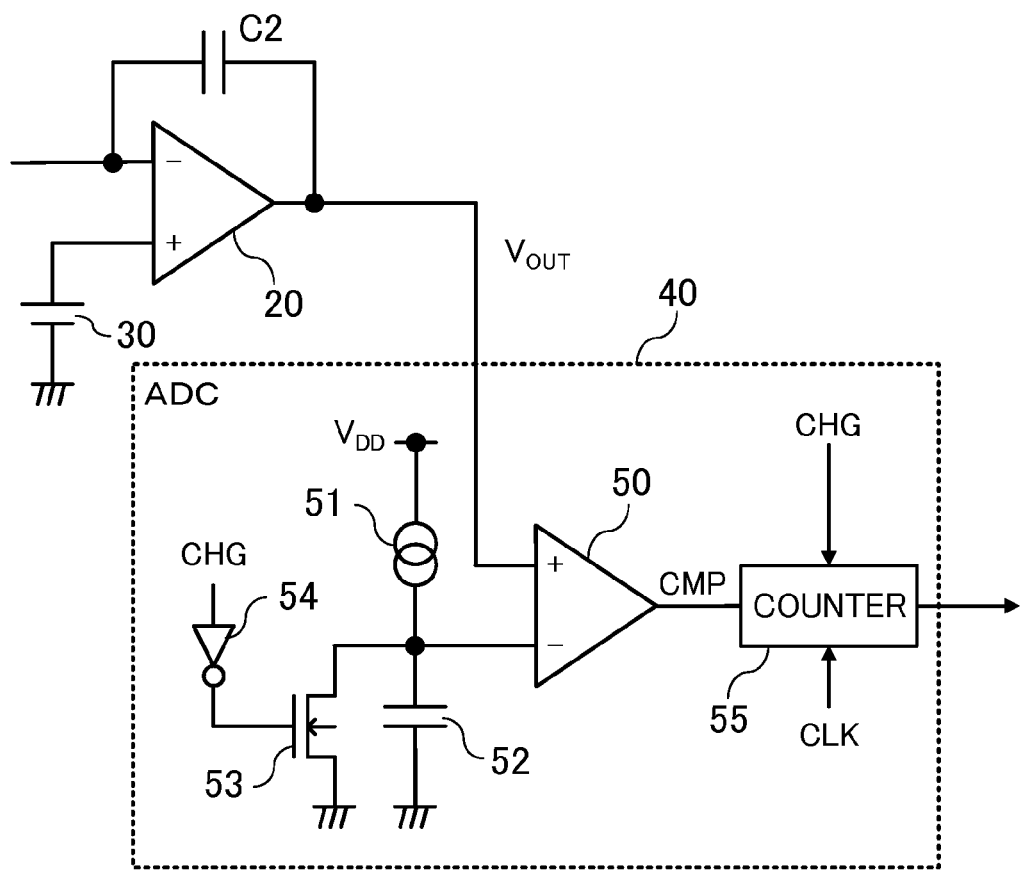
FIG. 3 is a diagram that shows an example of an ADC composition.

FIG. 3 is a diagram that shows a composition example of the ADC 40. The ADC includes a comparator 50, a current source 51, a capacitor 52, an N-channel MOSFET 53, an inverter 54, and a counter 55.

The comparator 50 has a positive input terminal applied with the output voltage $V_{OUT}$ output from the battery voltage detecting circuit 10A, and a negative input terminal connected to one end of the capacitor 52. An output signal CMP is output from the comparator 50, and applied to the counter 55. If the voltage $V_{OUT}$ is higher than the voltage at the capacitor 52, the output signal CMP will be at a level H. If the voltage at the capacitor 52 is higher than the voltage $V_{OUT}$, the output signal CMP will be at a level L.

The current source 51 has one end applied with a voltage $V_{DD}$, and the other end connected to one end of the capacitor 52 so that a constant current is supplied to the capacitor 52.

The N-channel MOSFET 53 has a drain connected to the one end of the capacitor 52, a source grounded, and a gate input with a signal CHG via the inverter 54. The signal CHG is a signal input from a microcomputer 45, for example. If the signal CHG is at a level L, the N-channel MOSFET 53 turns ON, and the capacitor 52 is discharged.

The counter 55 is input with the signal CHG output from the microcomputer 45, the signal CMP output from the comparator 50, and a clock signal CLK of a given cycle generated by a RC resonant circuit, for example. The counter 55 starts counting the clock signal CLK when the signal CHG shifts from the level L to the level H, and stops counting the same when the signal CMP shifts from the level H to the level L.

To convert the voltage output $V_{OUT}$ that is an analog value to a digital value, the microcomputer 45 sets the signal CHG to the level L so as to discharge the capacitor 52. Subsequently, the microcomputer 45 sets the signal CHG to the level H, causing the counter 55 to start counting operation thereof, and the capacitor 52 to be charged. When the capacitor 52 is charged and the voltage thereof reaches the output signal $V_{OUT}$, the signal CMP shifts to the level L to cause the counter 55 to stop the counting operation thereof. In this manner, the counter 55 output a count (a digital value) that is in proportion to the output voltage $V_{OUT}$.

==Operations==

Figure 4:
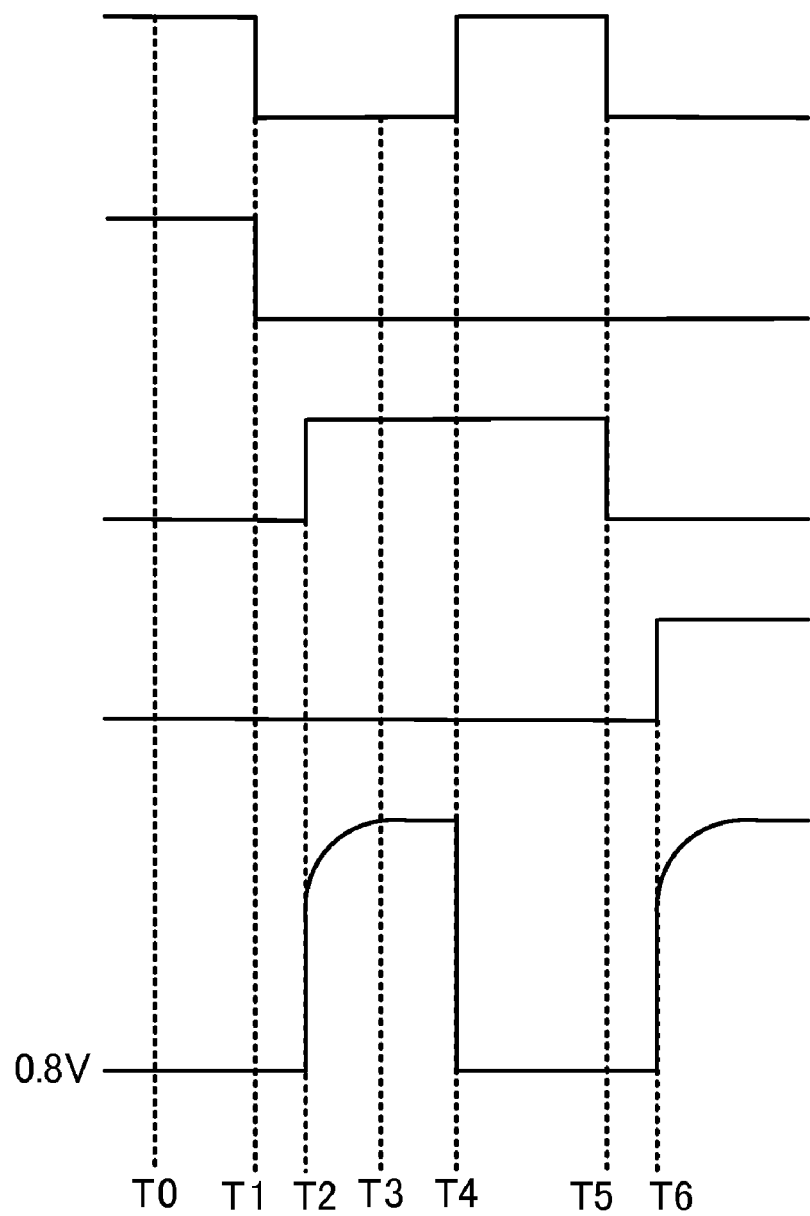
FIG. 4 is a timing chart that shows an example of an operation of the battery voltage detecting circuit shown in FIG. 1.

The operation of the battery voltage detecting circuit 10A is explained below. FIG. 4 is a timing chart that shows an example of an operation of the battery voltage detecting circuit 10A. The voltages applied to the terminals V1 to V4 are donated as V1 to V4, respectively. Voltages of the batteries BV1 to BV4 are denoted as $V_{BV1}$ to $V_{BV4}$, respectively.

At an initial state (at time T0), the switches SW4 and SW5 are ON, and the switches SW0 to SW3 are OFF. Because the switch SW5 is ON, the operational amplifier 20 operates to give a gain of 1, therefore, the reference voltage $V_{REF1}$=0.8 volts, applied to the positive input terminal thereof, is output as $V_{OUT}$. Because the switch SW4 is ON, a voltage of the capacitor C1 becomes $V_{C1}$=V4-$V_{REF1}$. Therefore, an electrical charge $Q_{C1}$ charged at the capacitor C1, assuming the capacitance of the capacitor is C1, will be $Q_{C1}$=$V_{C1}$·C1=(V4-$V_{REF1}$)·C1. Because the switch SW5 is ON, a voltage $V_{C2}$ at the capacitor C2 is 0 volt, and an electrical charge $Q_{C2}$ charged at the capacitor C2 is also 0.

The switches SW4 and SW5 are turned OFF at time T1, and the switch SW3 are turned ON at time T2. In this manner, a voltage V3 that is lower than the voltage V4 is applied to the one end of the capacitor C1, and a current I1 flows out from the output terminal of the operational amplifier 20 to the capacitor C1, the capacitor C2, the switch SW3, and the terminal V3.

Once the electrical charge at the capacitor C1 stabilizes at time T3, the voltage $V_{C1}$ becomes $V_{C1}$=V3-$V_{REF1}$, and an electrical charge $Q_{C1}$ becomes $Q_{C1}$=$V_{C1}$·C1=(V3-$V_{REF1}$)·C1. Therefore, a change $\Delta Q_{C1}$ of the electrical charge $Q_{C1}$ is $\Delta Q_{C1}$ (V4-$V_{REF1}$)·C1-(V3-$V_{REF1}$)·C1=(V4-V3)·C1. Because the capacitor C2 is charged by the same amount as the $\Delta Q_{C1}$, the electrical charge $Q_{C2}$ at the capacitor C2 also becomes $Q_{C2}$=(V4-V3)·C1. Therefore, the voltage $V_{C2}$ between both ends of the capacitor C2 is $V_{C2}$=(V4-V3)·C1/C2=$V_{BV4}$·C1/C2. The output voltage $V_{OUT}$ output from the operational amplifier 20 will be $V_{OUT}$=$V_{REF1}$+$V_{c2}$=$V_{REF1}$+$V_{BV4}$·C1/C2.

Because the C1 and C2 are known constants, the microcomputer 45 can calculate the voltage $V_{BV4}$ of the battery BV4 by obtaining the difference between the digital value of the output voltage $V_{OUT}$ (=$V_{REF1}$) at the time T0 and the digital value of the output voltage $V_{OUT}$ (=$V_{REF1}$+$V_{BV4}$·C1/C2) at the time T3.

When the switch SW5 are turned ON at time T4, the capacitor C2 is discharged and the $V_{C2}$ drops to 0 volt, and the output voltage $V_{OUT}$ will be $V_{OUT}$=$V_{REF1}$+$V_{C2}$=$V_{REF1}$. At time T5, the switches SW3 and SW5 are turned OFF, and at time T6, the switch SW2 is turned ON. By way of this switching, a voltage V2, which is lower than voltage V3, is applied to the one end of the capacitor C1, and the current I1 flows out from the output terminal of the operational amplifier 20 to the capacitor C2, the capacitor C1, the switch SW2, and the terminal V2. In this manner, the capacitor C2 is charged with an electrical charge that is in proportion to the voltage $V_{BV3}$ of the battery BV3, so that the voltage $V_{BV3}$ can be detected in the similar manner as for the voltage $V_{BV4}$.

By sequentially switching the switch SW5 to ON, the switch SW2 and SW5 to OFF, and the switch SW1 to ON in the similar manner, the voltage $V_{BV2}$ of the battery BV2 can be also obtained.

Figure 5:
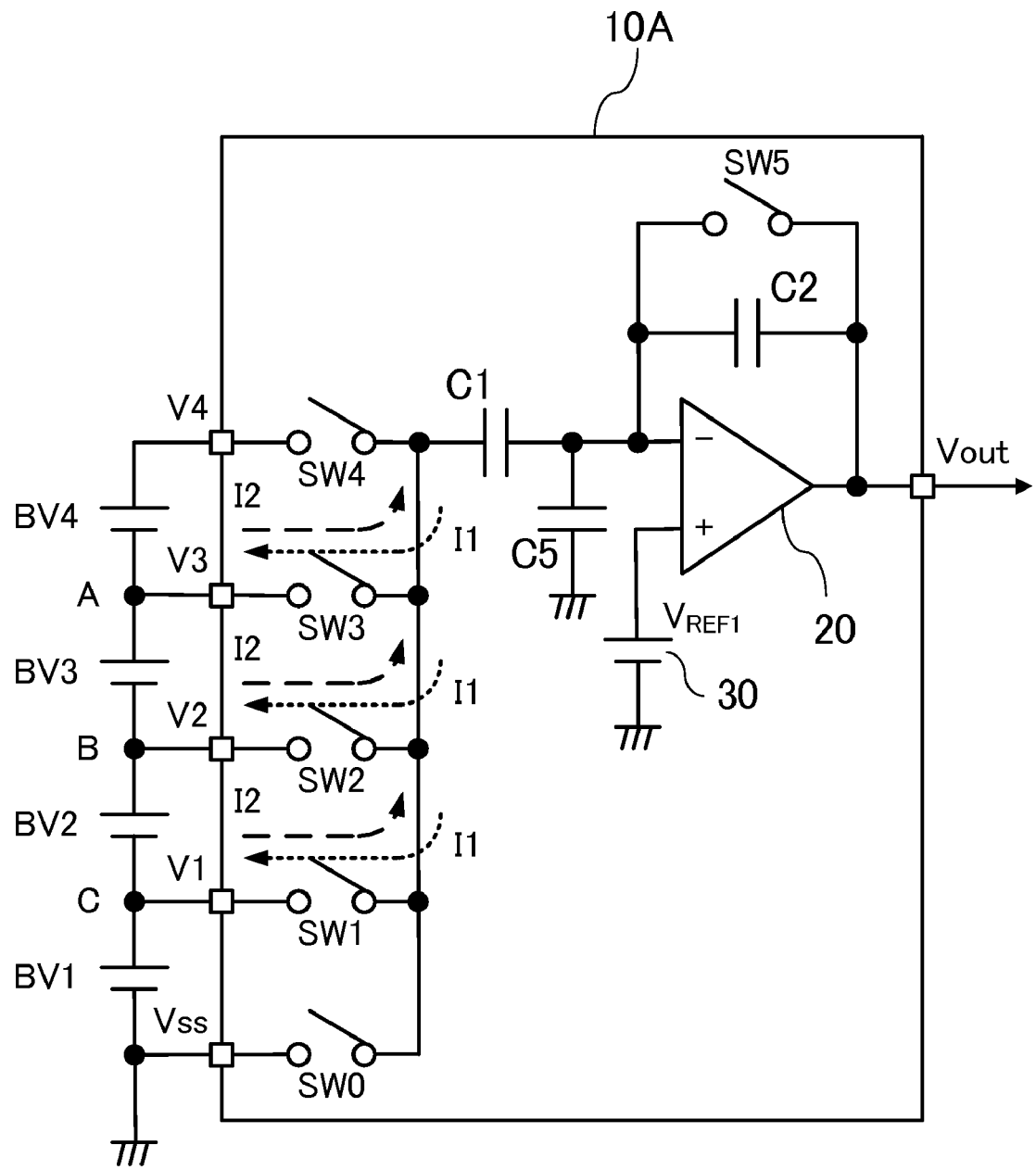

In this manner, by turning the switches SW4, SW3, SW2, SW1, and SW0 ON sequentially, the voltages $V_{BV1}$ to $V_{BV4}$ of the batteries BV1 to BV4 may be respectively detected. FIG. 5 is a diagram that shows the currents that flow when each of the switches SW1 to SW3 are turned ON. As described above, when the switches SW3, SW2, and SW1 are turned ON sequentially, the current I1 flows out from the capacitor C1 to the switch SW3, SW2, and SW1. After each of the voltages $V_{BV1}$ to $V_{BV1}$ of the batteries BV1 to BV4 are detected, the switch control circuit 35 turns ON the switches SW1, SW2, and SW3 sequentially. When the switch SW0 is turned OFF and the switch SW1 is turned ON, a current I2 in proportion to the voltage $V_{BV1}$ of the battery BV1 flows out from the terminal V1 to the switch SW1 and the capacitor C1. When the switch SW1 is turned OFF and the switch SW2 is turned ON, a current I2 in proportion to the voltage $V_{BV2}$ of the battery BV2 flows out from the terminal V2 to the switch SW2 and the capacitor C1. When the switch SW2 is turned OFF and the switch SW3 is turned ON, a current I2 in proportion to the voltage $V_{BV3}$ of the battery BV3 flows out from the terminal V3 to the switch SW3 and the capacitor C1.

In other words, at the points A to C shown in FIG. 5, the outgoing charge transferred by way of the current I2 cancels out the incoming charge transferred by the current I1. The battery voltage detecting circuit 10A repeats the entire operation to detect the battery voltage once in a few seconds, for example. Therefore, by canceling out the incoming charge with the outgoing charge, the battery voltage variation due to such battery voltage detection operation can be avoided.

Figure 6:
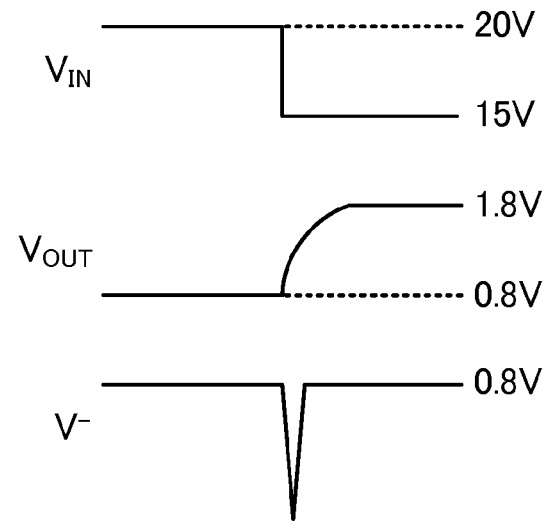
FIG. 6 is a diagram that shows an example of changes a voltage $V_{IN}$, an output voltage $V_{OUT}$, and a voltage $V^-$ make.

A function of the capacitor C5 in the battery voltage detecting circuit 10A is explained below. FIG. 6 is a diagram that shows an example of how a voltage $V_{IN}$ applied to the one end of the capacitor C1, the voltage $V_{OUT}$ output from the operational amplifier 20, and the change of a voltage $V^-$ applied at the negative input terminal of the operational amplifier 20. It is assumed here that each of the voltages $V_{BV1}$ to $V_{BV4}$ of the batteries BV1 to BV4 are 5 volts, the capacitance of the capacitor C1 is 2pF, the capacitance of the capacitor C2 is 10 pF, and the capacitance of the capacitor C5 is 20pF.

When the switch SW4 turns OFF and the switch SW3 turns ON, the voltage $V_{IN}$ applied to the one end of the capacitor C1 drops from 20 volt to 15 volts. If a response from the operational amplifier 20 is delayed, the capacitor C2 does not function as a capacitor, reducing the voltage at the other end of the capacitor C2, that is, reducing the voltage $V^-$. Assuming that the capacitor C5 is not provided, the voltage $V^-$ drops by $(20-15) \times 1/(1+5) \approx 0.83$, because the capacitance ratio between the capacitors C1 and C2 are 1 to 5. Therefore, the voltage $V^-$ drops from the 0.8 volts, which is at the same level as the reference voltage $V_{REF1}$, down to a negative voltage by approximately 0.83 volts. Depending on the reference voltage $V_{REF1}$ or the capacitance ratio between the capacitors C1 and C2, the voltage $V^-$ will be further lowered.

Figure 7:
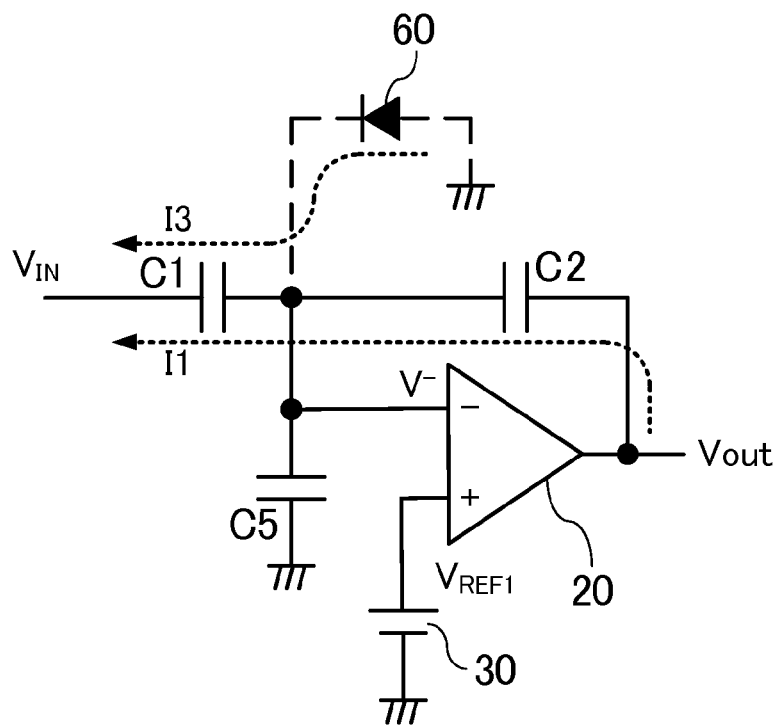
FIG. 7 is a diagram that shows paths of currents output from a parasitic diode.

If the voltage $V^-$ becomes negative, a current I3 will flow from a parasitic diode 60 to the capacitor C1, as shown in FIG. 7. If the current I3 flows in the shown path, the electrical charge accumulated at the capacitor C2 declines, further reducing the accuracy of the detection of the battery voltages.

When the capacitor C5 is provided, as shown in accordance to the first embodiment, the total capacitance ratio 30pF between the capacitor C1 (2pF) and the capacitors C2, C5 (30pF) is 1 to 15. Therefore, the voltage $V^-$ declines by $(20-15) \times 1/(1+15) \approx 0.31$. In other words, by providing the capacitor C5, reduction of the voltage $V^-$ is kept small. Therefore, generation of the current I3, caused by the negative voltage $V^-$, can be prevented, further preventing deterioration of the detection accuracy of the battery voltages.

SECOND EMBODIMENT

==Circuit Structure==

Figure 8:
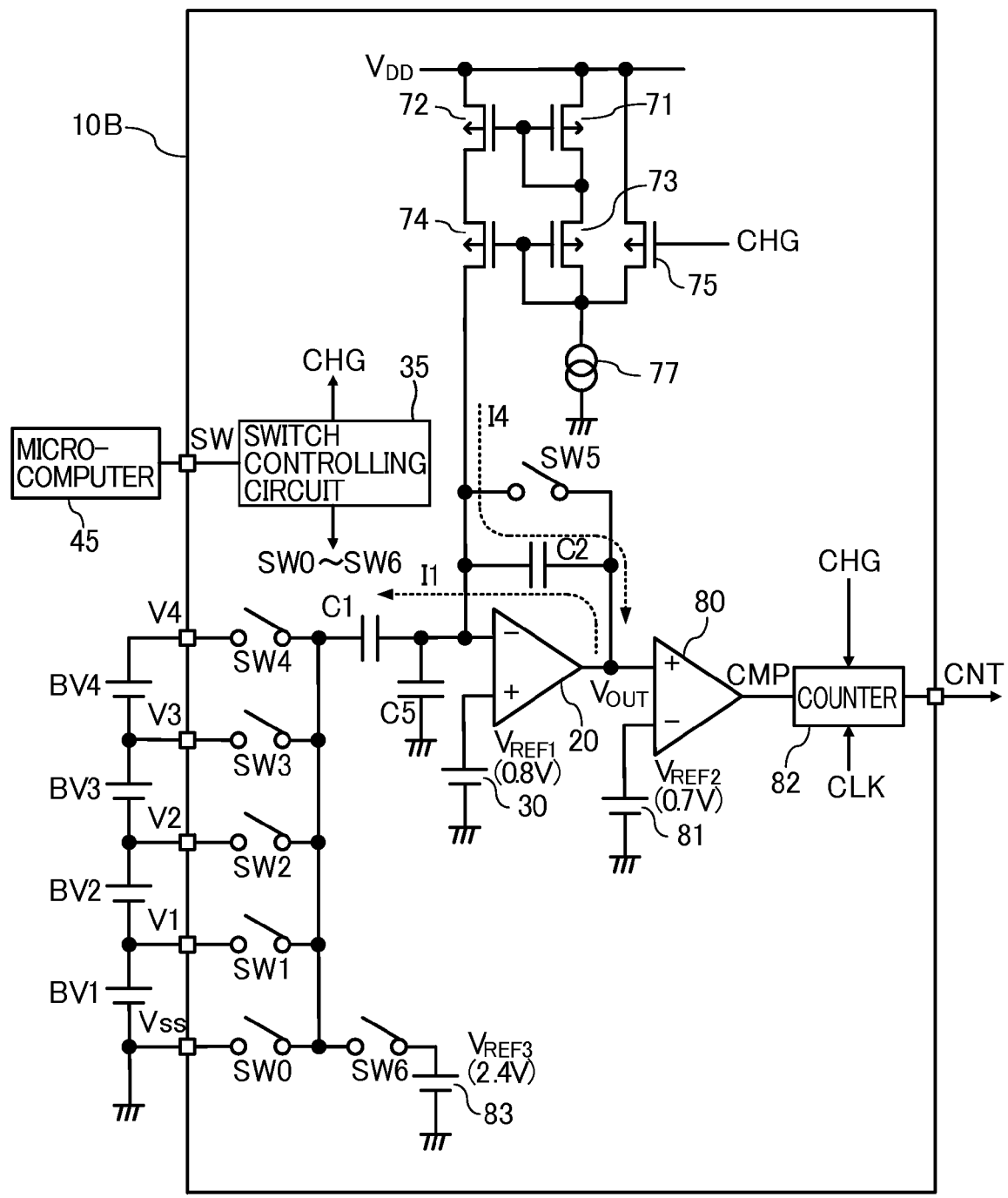
FIG. 8 is a diagram that shows a circuit structure of a battery voltage detecting circuit according to a second embodiment of the present invention.

FIG. 8 is a diagram that shows a circuit structure of a battery voltage detecting circuit according to a second embodiment of the present invention. The same elements as those in the battery voltage detecting circuit 10A according to the first embodiment are given the same reference numbers, and the explanation thereof are omitted herein. A battery voltage detecting circuit 10B includes the operational amplifier 20, the capacitors C1, C2, and C5, the switches SW0 to SW5, the power source 30, and the switch control circuit 35, as well as P-channel MOSFETs 71 to 75, a current source 77, a comparator 80, a power source 81, a counter 82, a power source 83, and a switch SW6. The switches SW0 to SW4 and the switch SW6 correspond to a switch circuit of the present invention.

The P-channel MOSFET 71 has a source applied with a power source voltage $V_{DD}$, a drain connected to a source of the P-channel MOSFET 73, and a gate connected to the drain thereof. The channel MOSFET 72 has a source applied with a power source voltage $V_{DD}$, a drain connected to a source of the P-channel MOSFET 74, and a gate connected to the gate of the P-channel MOSFET 71. The P-channel MOSFET 73 has the source connected to the drain of the P-channel MOSFET 71, a drain connected to the current source 77, and a gate connected to the drain thereof. The P-channel MOSFET 74 has a source connected to the drain of the P-channel MOSFET 72, a drain connected to the other end of the capacitor C2 (the end connected to the negative input terminal of the operational amplifier 20), and a gate connected to the gate of the P-channel MOSFET 73. The P-channel MOSFET 75 has a source applied with the power source voltage $V_{DD}$, a drain connected to the current source 77, and a gate applied with a signal CHG. In other words, a current mirror circuit is formed by the P-channel MOSFET 71 to 74. If the signal CHG is at the level H, the P-channel MOSFET 75 is turned OFF, and a constant current in proportion to the constant current output from the current source 77 flows into the capacitor C2.

The comparator 80 (a comparing circuit) has a positive input terminal connected to the output terminal of the operational amplifier 20, and a negative input terminal applied with a reference voltage $V_{REF2}$ (a second reference voltage) output from the power source 81. According to the second embodiment, $V_{REF2}=0.7$ volts. Therefore, a signal CMP output from the comparator 80 will be at a level H if the output voltage $V_{OUT}$ of the operational amplifier 20 is higher than 0.7 volts, and a level L if the output voltage $V_{OUT}$ of the operational amplifier 20 is below 0.7 volts.

The counter 82 receives the signal CHG from the switch control circuit 35, the signal CMP from comparator 80, and the clock signal CLK of a given cycle generated by a RC resonant circuit, for example. The counter 82 starts counting the clock signal CLK when the signal CHG shifts from the level L to the level H, and stops counting the same when the signal CMP shifts from the level H to the level L.

The switch SW6 has one end connected to the other end of the capacitor C1, and the other end applied with a reference voltage $V_{REF3}$ (a third reference voltage). According to the second embodiment, the reference voltage $V_{REF3}=2.4$ volts.

==Operations==

Figure 9:
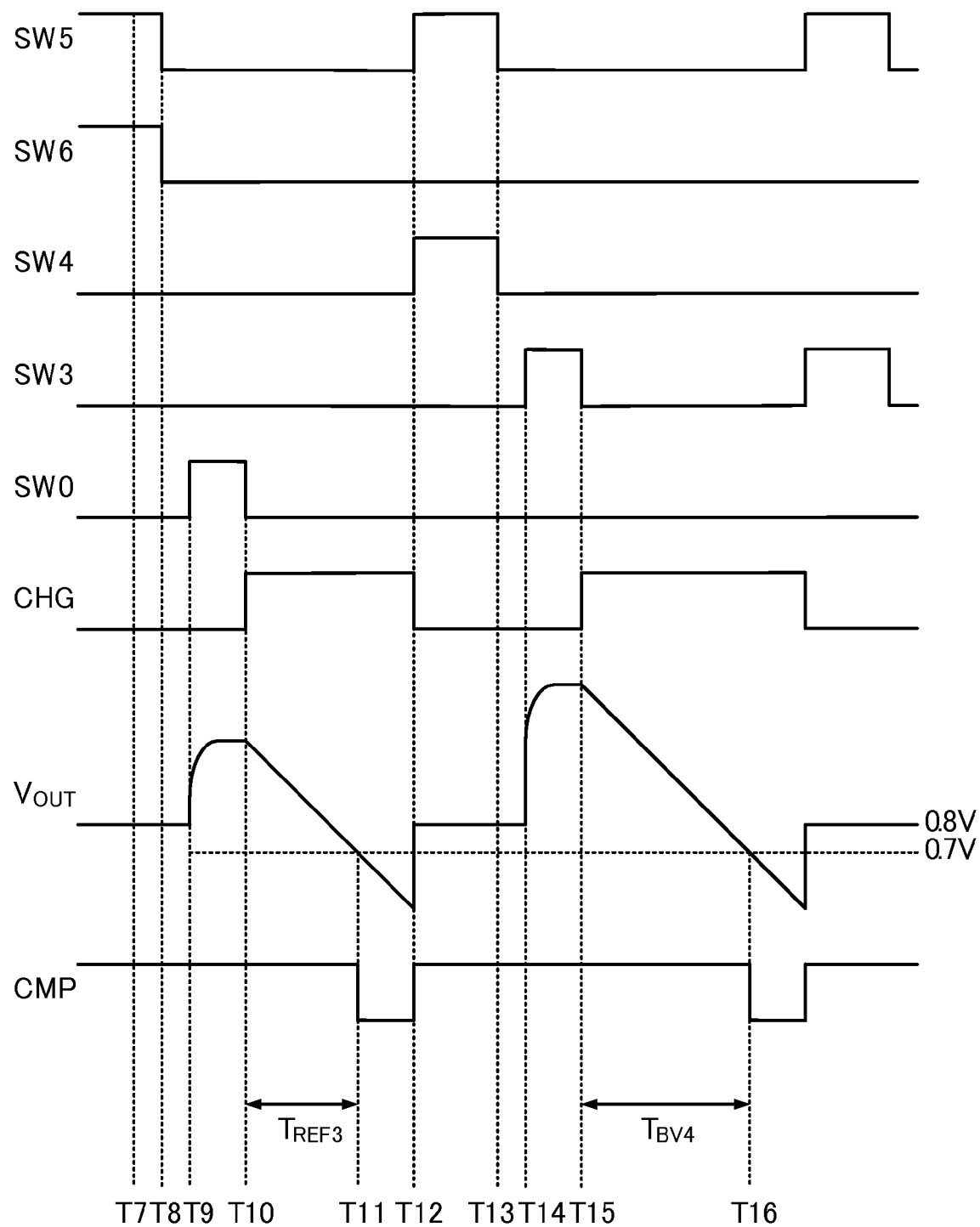
FIG. 9 is a timing chart that shows an example of an operation of the battery voltage detecting circuit shown in FIG. 8.

The operation of the battery voltage detecting circuit 10B is explained below. FIG. 9 is a timing chart that shows an example of the operation of the battery voltage detecting circuit 10B.

At an initial state (at time T7), the switches SW5 and SW6 are ON, and the switches SW0 to SW4 are OFF. Because the switch SW5 is ON, the operational amplifier 20 operates to give a gain of 1, and the reference voltage $V_{REF1}=0.8$ volts, applied to the positive input terminal thereof, is output as $V_{OUT}$. Therefore, the output signal CMP from the comparator 80 is at the level H. Also because the switch SW6 is ON, the one end of the capacitor C1 is applied with the reference voltage $V_{REF3}$ output from the power source 83.

The switches SW5 and SW6 are turned OFF at time T8, and the switch SW0 turns ON at time T9. By way of this switching, the one end of the capacitor C1 is applied with a ground voltage, and the current I1 flows out from the output terminal of the operational amplifier 20 to the capacitor C2, the capacitor C1, the switch SW0, and the terminal $V_{SS}$. The capacitor C2 is charged with this current I1, raising the output voltage $V_{OUT}$.

Once the electrical charge at the capacitor C1 stabilizes at time T10, the switch control circuit 35 turns OFF the switch SW0. At this time, the output voltage $V_{OUT}$ is $V_{OUT}=V_{REF1}+V_{REF3}\cdot C1/C2$. When the switch control circuit 35 sets the signal CHG to the level H at the time 10, the P-channel MOSFET 75 is turned OFF and a constant current I4 flows out from the P-channel MOSFET 74 to the capacitor C2 and the output terminal of the operational amplifier 20. By way of this constant current I4, the electrical charge accumulated at the capacitor C2 is discharged at a constant rate, bringing down the output voltage $V_{OUT}$ at the constant rate. When the signal CHG is set to the level H, the counter 82 also starts counting the clock signal CLK.

Subsequently at time T11, the output voltage $V_{OUT}$ drops to 0.7 volts, which is the level of the reference voltage $V_{REF2}$ applied to the negative input terminal of the comparator 80, the signal CMP output from the comparator 80 shifts to the level L, and the counter 82 stops counting the clock signal CLK. Time $T_{REF3}$, counted by the counter 82 between the time T10 and T11, corresponds to the reference voltage $V_{REF3}$ (=2.4 volts). In other words, assuming the inclination of the output voltage $V_{OUT}$ between the time T10 and the time T11 counted by the counter 82 as $-1/K$, $T_{REF3}=K\cdot(V_{REF1}+V_{REF3}\cdot C1/C2-V_{REF2})=K\cdot(V_{REF3}\cdot C1/C2+0.1)$. When the switch control circuit 35 switches the signal CHG to the level L at time T12, the P-channel MOSFET 75 is turned ON, and the constant current I4 stops discharging the capacitor C2. At time the T12, the switch control circuit 35 also turns ON the switch SW5. By turning ON the switches SW4 and SW5, the output voltage $V_{OUT}$ becomes equal to the reference voltage $V_{REF1}$=0.8 volts, and the signal CMP output from the comparator 80 is switched to the level H. By turning the switch SW4 ON, the voltage V4 is applied to the one end of the capacitor C1.

The switches SW4 and SW5 are turned OFF at time T13, and the switch SW3 is turned ON at time T14. By way of this switching, the one end of the capacitor C1 is applied with the voltage V3, which is lower than the voltage V4, and the current I1 flows out from the output terminal of the operational amplifier 20 to the capacitor C2, the capacitor C1, the switch SW3, and the terminal V3. The capacitor C2 is charged by this current I1, raising the output voltage $V_{OUT}$.

Once the electrical charge at the capacitor C1 stabilizes at time T15, the switch control circuit 35 turns OFF the switch SW3. At this time, the output voltage $V_{OUT}$ is $V_{OUT}=V_{REF1}+V_{BV4}\cdot C1/C2$. If the switch control circuit 35 sets the signal CHG to the level H at the time T15, the P-channel MOSFET 75 is turned OFF, and the constant current I4 flows out from the P-channel MOSFET 74 into the capacitor C2 and the output terminal of the operational amplifier 20. By way of this constant current I4, the electrical charge accumulated at the capacitor C2 is discharged at a constant rate, bringing down the output voltage $V_{OUT}$ at the constant rate. When the signal CHG is set to the level H, the counter 82 also starts counting the clock signal CLK.

Subsequently at time T16, the output voltage $V_{OUT}$ drops to 0.7 volts, which is the level of the reference voltage $V_{REF2}$ applied to the negative input terminal of the comparator 80, the signal CMP output from the comparator 80 is switched to the level L, and the counter 82 stops counting the clock signal CLK. Time $T_{BV4}$, counted by the counter 82 between the time T15 and T16, corresponds to the voltage $V_{BV4}$. In other words, assuming the inclination of the output voltage $V_{OUT}$ between the time T15 and the time T16 counted by the counter 82 is $-1/K$, $T_{BV4}=K\cdot(V_{REF1}+V_{BV4}\cdot C1/C2-V_{REF2})=K\cdot(V_{BV4}\cdot C1/C2+0.1)$.

The microcomputer 45 can calculate the voltage $V_{BV4}$ of the battery BV4 from the $T_{REF3}$ and $T_{BV4}$ measured by the counter 82. More specifically, $V_{BV4}=(C2/C1)\cdot(T_{BV4}-T_{REF3})/K+V_{REF3}$. By calculating voltage $V_{BV4}$ by comparing the count $T_{REF3}$, counted with the reference voltage $V_{REF3}$, and the count $T_{BV4}$, counted with the voltage $V_{BV4}$ of the battery BV4, the battery voltage can be detected more accurately. For example, if the clock signal CLK is generated by a less accurate circuit such as an RC resonant circuit and the voltage of $V_{BV4}$ of the battery BV4 is calculated based only on the $T_{BV4}$ measured by the counter 82, the detected voltage $V_{BV4}$ becomes less accurate, for example, due to change in the clock frequency caused by temperature variation. By comparing the $T_{BV4}$ with the count $T_{REF3}$ counted with the given reference voltage $V_{REF3}$, as explained for the second embodiment, the effect of the clock frequency variation can be cancelled out, allowing more accurate detection of the voltage $V_{BV4}$ of the battery BV4.

At time T16 and thereafter, the voltages $V_{BV1}$ to $V_{BV3}$ of the batteries BV1 to BV3 can be also detected by controlling the switches SW0 to SW5 in the same manner as in the first embodiment, and discharging the capacitor C2 at a constant rate by way of the current I4, in the same manner as described above.

THIRD EMBODIMENT

==Circuit Structure==

Figure 10:
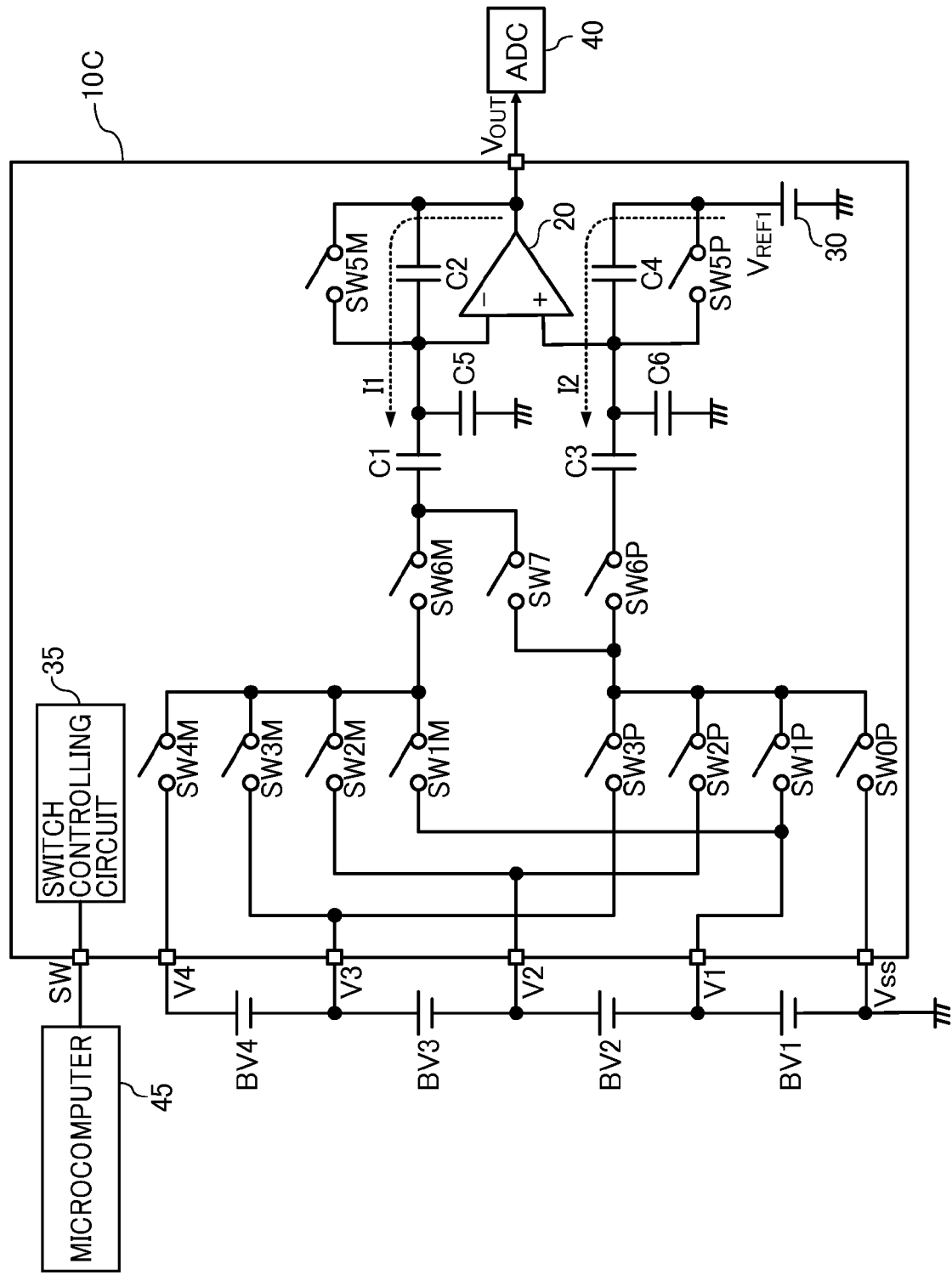
FIG. 10 is a diagram that shows a circuit structure of a battery voltage detecting circuit according to a third embodiment of the present invention.

FIG. 10 is a diagram that shows a circuit structure of a battery voltage detecting circuit according to a third embodiment of the present invention. A battery voltage detecting circuit 10C shown in FIG. 10 is the same as the battery voltage detecting circuit 10A according to the first embodiment, except the former performs a differential operation. A capacitor C6 is provided to perform the same function as the capacitor C5. According to the third embodiment, the capacitances of the capacitors C1 to C6 are denoted as C1 to C6, respectively. Also, C1/C2=C3/C4 is established. According to the third embodiment, the capacitors C1 to C6 are made of the wiring capacitances, in the same manner as in the first embodiment. The capacitors C1 to C5 correspond to a first to fifth capacitors of the present invention. The switches SW0P to SW3P, SW1M to SW4M, SW6M, SW6P, and SW7 correspond to a switch circuit of the present invention, and the switches SW5M and W5P correspond to a discharging circuit of the present invention.

==Operations==

Figure 11:
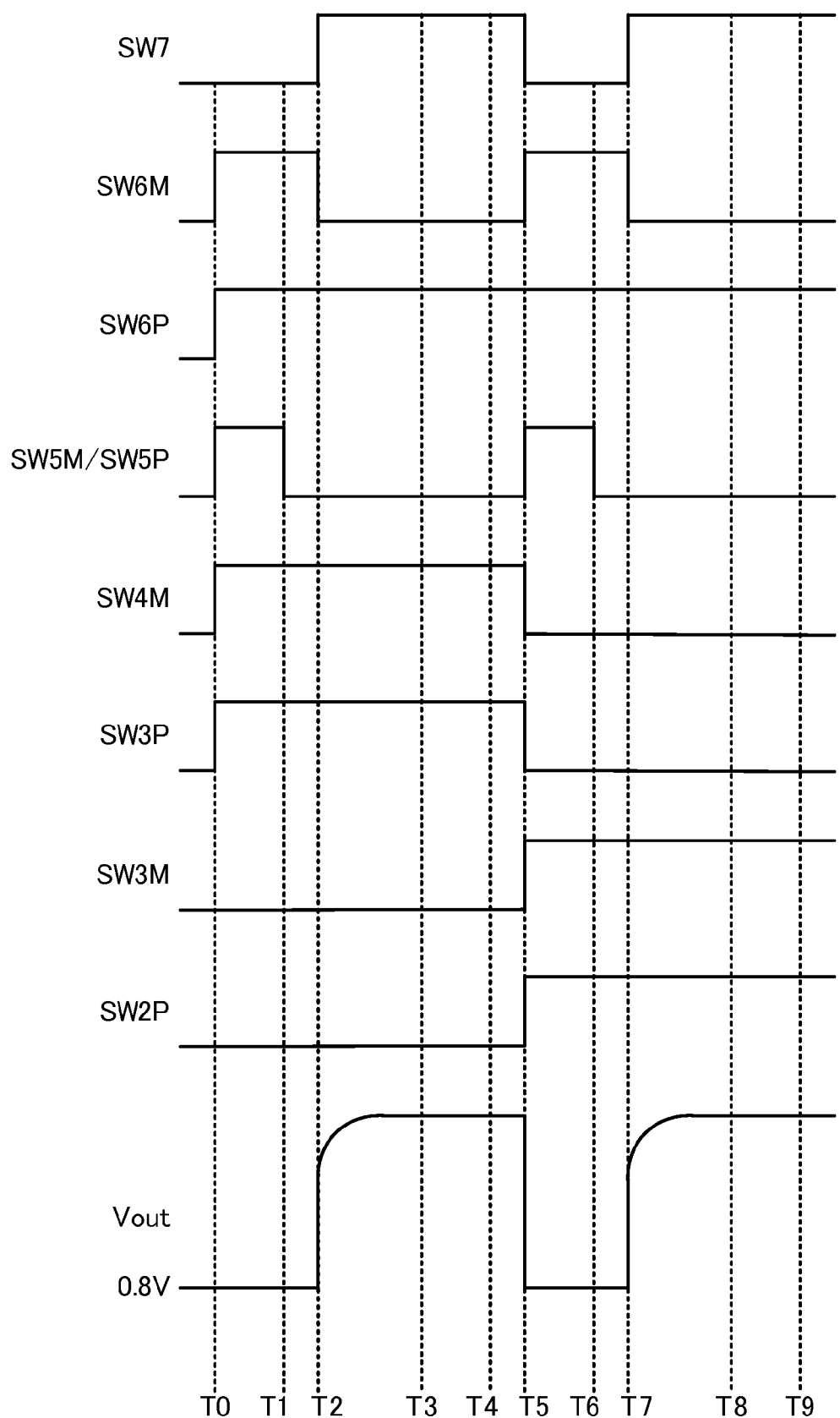
FIG. 11 is a timing chart that shows an example of an operation of the battery voltage detecting circuit shown in FIG. 10.

The operation of the battery voltage detecting circuit 10C is explained below. FIG. 11 is a timing chart that shows an example of the operation of the battery voltage detecting circuit 10C.

At time T0, the switches SW4M, SW3P, SW6M, SW6P, SW5M, and SW5P are turned ON, and the switches SW0P to SW2P, SW1M to SW3M, and SW7 are turned OFF. Because the SW5M and SW5P are ON, the operational amplifier 20 operates to give a gain of 1, and the reference voltage $V_{REF1}$=0.8 volts, applied to the positive input terminal thereof, is output as $V_{OUT}$. Also because the SW4 and SW6M are ON, the voltage $V_{C1}$ at the capacitor C1 is $V_{C1}=V4-V_{REF1}$. Therefore, an electrical charge $Q_{C1}$ charged at the capacitor C1 will be $Q_{C1}=V_{C1}\cdot C1=(V4-V_{REF1})\cdot C1$. Because the switch SW5M is ON, a voltage $V_{C2}$ at the capacitor C2 is 0 volt, and an electrical charge $Q_{C2}$ charged at the capacitor C2 is also 0. Because the SW3P and SW6P are ON, the voltage $V_{C3}$ at the capacitor C3 is $V_{C3}=V3-V_{REF1}$. Therefore, an electrical charge $Q_{C3}$ charged at the capacitor C3 will be $Q_{C3}=V_{C3} \cdot C3=(V3-V_{REF1}) \cdot C3$. Because the switch SW5P is ON, a voltage $V_{C4}$ at the capacitor C4 is 0 volt, and an electrical charge $Q_{C4}$ charged at the capacitor C4 is also 0.

The switches SW5M and SW5P are turned OFF at time T1, and the switch SW6M is turned OFF and the switch SW7 is turned ON at time T2. In this manner, the voltage V3, which is lower than the voltage V4, is applied to the other end of the capacitor C1, and a current I1 flows out from the output terminal of the operational amplifier 20 to the capacitor C2, the capacitor C1, the switch SW7, the switch SW3P and the terminal V3.

Once the electrical charge at the capacitor C1 stabilizes at time T3, the voltage $V_{C1}$ is $V_{C1}=V3-V_{REF1}$, and the electrical charge $Q_{C1}$ is $Q_{C1}=V_{C1} \cdot C1=(V3-V_{REF1}) \cdot C1$. Therefore, a change $\Delta Q_{C1}$ of the electrical charge $Q_{C1}$ is $\Delta Q_{C1}=(V4-V_{REF1}) \cdot C1=(V3-V_{REF1}) \cdot C1=(V4-V3) \cdot C1$. Because the capacitor C2 is charged with by the same amount as the $\Delta Q_{C1}$ by the current I1, the electrical charge $Q_{C2}$ at the capacitor C2 also becomes $Q_{C2}=(V4-V3) \cdot C1$. Therefore, the voltage $V_{C2}$ between both ends of the capacitor C2 is $V_{C2}=(V4-V3) \cdot C1/C2=V_{BV4} \cdot C1/C2$. Because an electrical charge $Q_{C4}$ accumulated at the capacitor C4 is 0, a voltage $V^+$ applied to the positive input terminal of the operational amplifier 20 becomes $V_{REF1}$, and a voltage $V^-$ applied the negative input terminal of the operational amplifier 20 also becomes $V_-=V^+=V_{REF1}$. Therefore, the output voltage $V_{OUT}$ output from the operational amplifier 20 will be $V_{OUT}=V_{REF1}+V_{C2}=V_{REF1}+V_{BV4} \cdot C1/C2$.

Because the C1 and C2 are known constants, the microcomputer 45 can calculate the voltage $V_{BV4}$ of the battery BV4 by obtaining the difference between the digital value of the output voltage $V_{OUT}$ ($=V_{REF1}$) at the time T0 and the digital value of the output voltage $V_{OUT}$ ($=V_{REF1}+V_{BV4} \cdot C1/C2$) at the time T3.

If the batteries BV1 to BV4 are used as a driving power for a laptop PC, for example, the voltages V1 to V4 can decline simultaneously by a same level due to increase in processing load. If the voltage V3 declines to V3' at the time T4, the voltage applied to the other end of the capacitor C1 also declines from V3 to V3', and the current I1 flows out even more from the output terminal of the operational amplifier 20 to the capacitor C2, the capacitor C1, the switch SW7, the switch SW3P, and the terminal V3. Because the voltage applied to the other end of the capacitor C3 also declines from V3 to V3', a current I2 also flows out from the power source 30 to the capacitor C4, the capacitor C3, the switch SW6P, the switch SW3P, and the terminal V3.

By way of the current I2, the electrical charge $Q_{C3}$ changes by $\Delta Q_{C3}$, that is, $\Delta Q_{C3}=(V3-V3') \cdot C3$. Because the capacitor C4 is charged by the same amount with the $\Delta Q_{C3}$ by the current I2, the electrical charge $Q_{C4}$ of the capacitor C4 becomes $Q_{C4}=(V3-V3') \cdot C3$. For this reason, the voltage $V_{C4}$ between both ends of the capacitor C4 becomes $V_{C4}=(V3-V3') \cdot C3/C4$. The voltage $V^+$, applied to the positive input terminal of the operational amplifier 20, becomes $V_{REF1}-V_{C4}$. By way of the current I1, a change $\Delta Q_{C1}$ of the electrical charge $Q_{C1}$ becomes $\Delta Q_{C1}=(V3-V3') \cdot C1$. Because the electrical charge in the same in amount with the $\Delta Q_{C1}$ is further charged in the capacitor C2 by the current I1, the electrical charge $Q_{C2}$ of the capacitor C2 becomes $Q_{C2}=(V4-V3) \cdot C1+(V3-V3') \cdot C1=(V4-V3') \cdot C1$. Therefore, the voltage $V_{C2}$ between both ends of the capacitor C2 becomes $V_{C2}=(V4-V3') \cdot C1/C2$. The voltage $V^-$, applied to the negative input terminal of the operational amplifier 20, is $V^-=V^+=V_{REF1}-V_{C4}=V_{REF1}-(V3-V3') \cdot C3/C4$. Therefore, the voltage $V_{OUT}$ output from the operational amplifier 20 is $V_{OUT}=V_{REF1}-(V3-V3') \cdot C3/C4+(V4-V3') \cdot C1/C2=V_{REF1}+(V4-V3) \cdot C1/C2=V_{REF1}+V_{DB4} \cdot C1/C2$, and is the same as at the time T3.

In other words, even if the voltages V1 to V4 decline simultaneously by approximately the same degree, the voltage variations at the positive and the negative input terminals of the operational amplifier 20 are kept approximately the same, because the switch SW7 is ON. Therefore, the output voltage $V_{OUT}$ does not change. In this manner, the voltage $V_{BV4}$ of the battery BV4 can be detected at high accuracy regardless of the timing the detection is performed.

The switches SW5M and SW5P are turned ON at time T5, discharging the capacitors C2 and C4. Thus, the voltage $V_{C2}$ and $V_{C4}$ become 0 volt, and the output voltage $V_{OUT}$ is $V_{OUT}=V_{REF1}$. At the time T5, the switches SW4M, SW3P, and SW7 are turned OFF, and the switches SW3M, SW6M, and SW2P are turned ON. By way of this switching, the voltage V2, which is lower than the voltage V3, is applied to the other end of the capacitor C3, and the current I2 flows out from the power source 30 to the switch SW5P, the capacitor C3, the switch SW6P, the switch SW2P, and the terminal V2. The switches SW5M and SW5P are turned OFF at time T6, and subsequently, the switch SW6M is turned OFF and the switch SW7 is turned ON at time T7. By way of this switching, the voltage V2, which is lower than the voltage V3, is applied to the other end of the capacitor C1, and the current I1 flows out from the output terminal of the operational amplifier 20 to the capacitor C2, the capacitor C1, the switch SW7, the switch SW2P, and the terminal V2. In this manner, the capacitor C2 accumulates the electrical charge in proportion to the $V_{BV2}$ of the battery BV2, enabling to obtain voltage $V_{BV2}$, in the same manner as for the voltage $V_{BV4}$. Even if, for example, the voltages V1 to V4 decline simultaneously by approximately the same degree, the voltage variations at the positive and the negative input terminals of the operational amplifier 20 are kept approximately the same, because the switch SW7 is ON.

By sequentially turning the switches SW5M and SW5P ON, the switch SW3M, SW2P, and SW7 OFF, and the switches SW2M, SW6M, and SW1P ON, the switches SW5M and SW5P OFF, SW6M OFF and SW7 ON, in the similar manner, the voltage $V_{BV2}$ of the battery BV2 can be obtained. Furthermore, by turning the switches SW5M and SW5P ON, the switch SW2M, SW1P, and SW7 OFF, and the switches SW1M, SW6M, and SW0P ON, the switches SW5M and SW5P OFF, the switch SW6M OFF and SW7 ON, in the similar manner, the voltage $V_{BV1}$ of the battery BV1 can be obtained.

In this manner, the voltages $V_{BV1}$ to $V_{BV4}$ of the battery BV1 to BV4 can be detected by sequentially applying the voltages V4, V3, V2, V1, and $V_{SS}$ to the other end of the capacitor C1, and by sequentially applying the voltages V4, V3, V2, V1, and $V_{SS}$ to the other end of the capacitor C3. As described above, when the voltage applied to the other end of the capacitor C1 declines from V4 to V3, the current I1 flows out from the terminal V3. In the similar manner, when the voltage applied to the other end of the capacitor C1 declines from V3 to V2, the current I1 flows out from the terminal V2. When the voltage applied to the other end of the capacitor C1 declines from V2 to V1, the current I1 flows out from the terminal V1. When the voltage applied to the other end of the capacitor C3 declines from V3 to V2, the current I2 flows out from the terminal V2. When the voltage applied to the other end of the capacitor C3 declines from V2 to V1, the current I2 flows out from the terminal V1.

After detecting the voltages $V_{BV1}$ to $V_{BV4}$ of the battery BV1 to BV4, the switch control circuit 35 controls, for example, the switch circuit SW1M to SW3M, SW6M to apply the voltage V1, V2 and V3 sequentially to the other end of the capacitor C1. The switch control circuit 35 also controls, for example, the switch circuit SW1P, SW2P, and SW6P in order to apply the voltage V1 and V2 sequentially to the other end of the capacitor C3. For example, by turning the switches SW1M and SW6M ON, the voltage V1 is applied to the other end of the capacitor C1. In this manner, the voltage applied to the other end of the capacitor C1 changes from $V_{SS}$ to V1, and the other end of the capacitor C1 receives a current in proportion to the voltage $V_{BV1}$ of the battery BV1 from the terminal V1. Also, for example, by turning the switches SW1P and SW6P ON, the voltage V1 is applied to the other end of the capacitor C3. In this manner, the voltage applied to the other end of the capacitor C3 changes from $V_{SS}$ to V1, and the other end of the capacitor C3 receives a current in proportion to the voltage $V_{BV1}$ of the battery BV1 from the terminal V1. In other words, from the view point of the terminal V1, the electrical charge accumulated by way of the current I1 and I2 is cancelled out by the outgoing charge. At terminals V2 and V3, in the same way, the electrical charge accumulated by way of the current I1 and I2 is cancelled out by the outgoing charge. The battery voltage detecting circuit 10C repeats the operation of detecting the battery voltage once in a few seconds, for example. Therefore, by canceling out the incoming charge by the outgoing charge, the battery voltage variation due to such battery voltage detection can be avoided.

FOURTH EMBODIMENT

==Circuit Structure==

Figure 12:
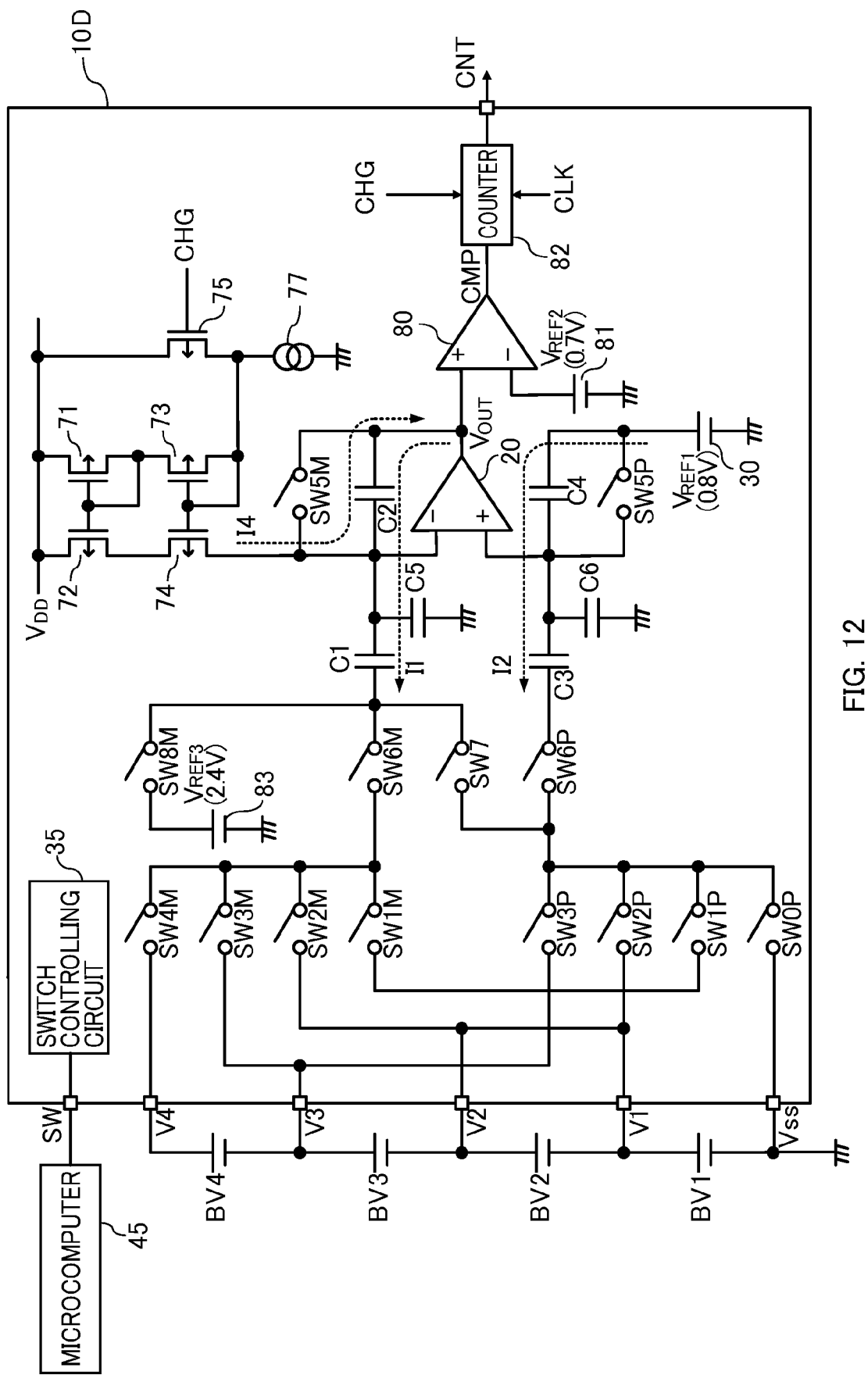
FIG. 12 is a diagram that shows a circuit structure of a battery voltage detecting circuit according to a fourth embodiment of the present invention.

FIG. 12 is a diagram that shows a circuit structure of a battery voltage detecting circuit according to a fourth embodiment of the present invention. A battery voltage detecting circuit 10D shown in FIG. 12 is the same as the battery voltage detecting circuit 10B according to the second embodiment, except the former performs a differential operation. The switches SW0P to SW3P, SW1M to SW4M, SW6M, SW6P, SW7, and a switch SW8M correspond to another switch circuit of the present invention.

==Operations==

Figure 13:
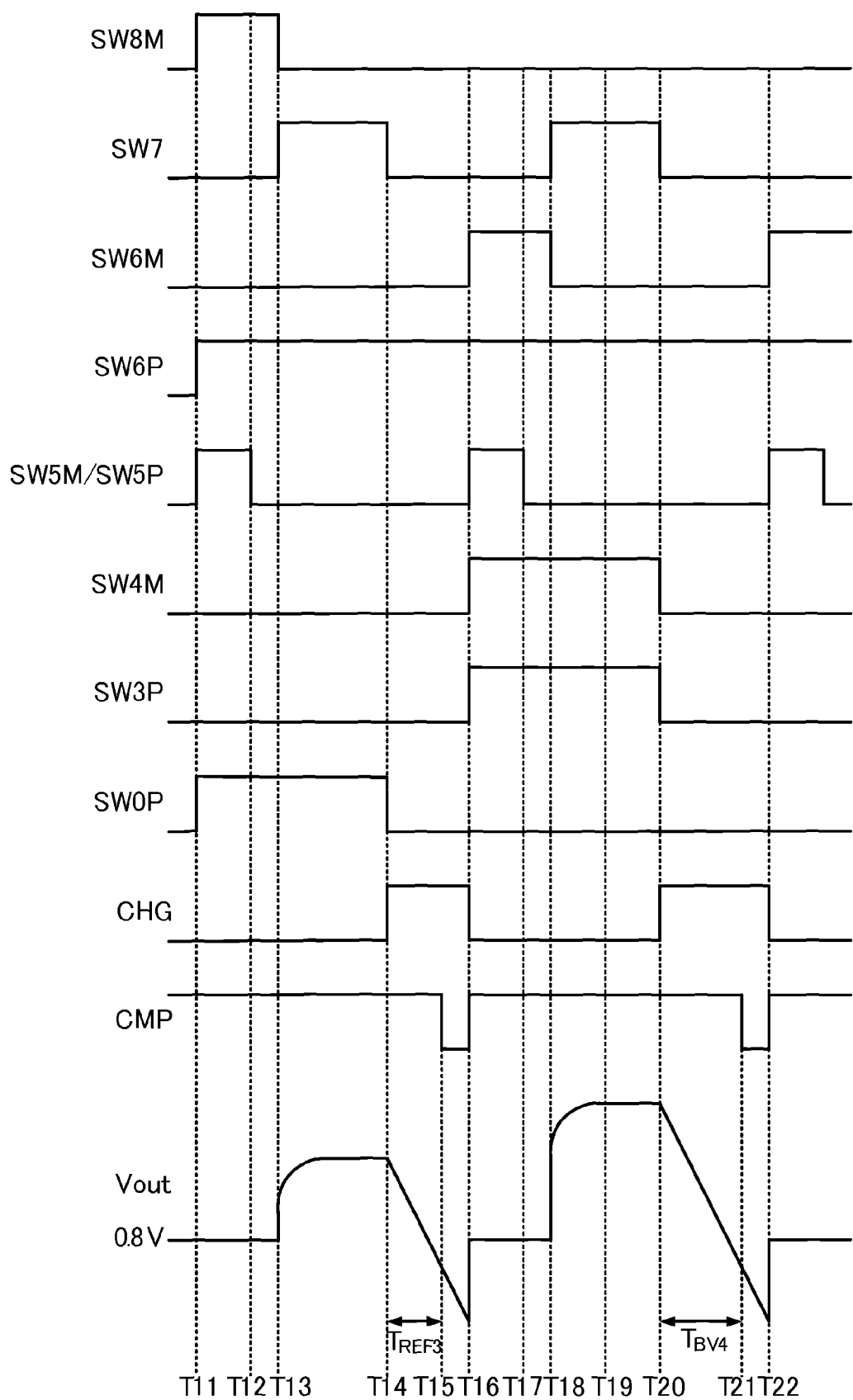
FIG. 13 is a timing chart that shows an example of an operation of the battery voltage detecting circuit shown in FIG. 12.

The operation of the battery voltage detecting circuit 10D is now explained. FIG. 13 is a timing chart that shows an example of the operation of the battery voltage detecting circuit 10D.

At time T11, the switches SW5M, SW5P, SW8M, SW0P, and SW6P are turned ON, and the switches SW1M to SW4M, SW1P to SW3P, SW6M, and SW7 are turned OFF. Because the SW5M and SW5P are ON, the operational amplifier 20 acts to give a gain of 1, and the reference voltage $V_{REF1}$=0.8 volts, applied to the input terminal thereof, is output as the $V_{out}$. Therefore, the signal output from the comparator 80 is at the level H. Because the switch SW8M is ON, the other end of the capacitor C1 is applied with the reference voltage $V_{REF3}$ that is output from the power source 83. Because the switches SW0P and SW6P are ON, the other end of the capacitor C3 is applied with the ground voltage $V_{ss}$.

At time T12, the switches SW5M and SW6P are turned OFF, and at time T13, the switch SW8M is turned OFF and the switch SW7 is turned ON. By way of this switching, the ground voltage $V_{SS}$ is applied to the other end of the capacitor C1, and the current I1 flows out from the output terminal of the operational amplifier 20 to the capacitor C2, the capacitor C1, the switch SW7, the switch SW0P, and the terminal $V_{SS}$. This current charges the capacitor C2, and raises the output voltage $V_{OUT}$.

Once the electrical charge at the capacitor C1 stabilizes, the switch control circuit 35 turns OFF the switches SW0P and SW7 at time T14. At this time the output voltage $V_{OUT} = V_{REF1} + V_{REF3} \cdot C1/C2$. The switch control circuit 35 sets the signal CHG to the level H at the time 14, the P-channel MOSFET 75 is turned OFF and a constant current I4 flows out from the P-channel MOSFET 74 to the capacitor C2, and the output terminal of the operational amplifier 20. By way of this constant current I4, the electrical charge accumulated at the capacitor C2 is discharged at a constant rate, bringing down the output voltage $V_{OUT}$ at the constant rate. Also, when the signal CHG is set to the level H, the counter 82 also starts counting the clock signal CLK.

Subsequently at T15, the output voltage $V_{OUT}$ drops to 0.7 volts, which is the level of the reference voltage $V_{REF2}$ applied to the negative input terminal of the comparator 80, the signal CMP output from the comparator 80 is switched to the level L, and the counter 82 stops counting the clock signal CLK. The time $T_{REF3}$, counted by the counter 82 between the time T14 and T15, corresponds to the reference voltage $V_{REF3}$ (=2.4V). In other words, assuming the inclination of the output voltage $V_{OUT}$ between the time T14 to the time T15 counted by the counter 82 is $-1/K$, $T_{REF3} = K \cdot (V_{REF1} + V_{REF3} \cdot C1/C2 - V_{REF2}) = K \cdot (V_{REF3} \cdot C1/C2 + 0.1)$. When the switch control circuit 35 changes the signal CHG to the level L at time T16, the P-channel MOSFET 75 is turned ON, and the constant current I4 stops discharging the capacitor C2. The switch control circuit 35 also turns the switches SW4M, SW3P, SW6M, SW6P, SW5M, and SW5P ON at time the T16. By turning the switches SW5M and SW5P ON, the output voltage $V_{OUT}$ becomes equal to the $V_{REF1}$=0.8 volts, and the signal CMP output from the comparator 80 is switched to the level H. By turning the switch SW4M and SW6M ON, the voltage V4 is applied to the one end of the capacitor C1. By turning the switch SW3P and SW6P ON, the voltage V3 is applied to the one end of the capacitor C3.

The switches SW5M and SW5P are turned OFF at time T17, and the switch SW6M is turned OFF and the switch SW7 is turned ON at time T18. By way of this switching, the other end of the capacitor C1 is applied with the voltage V3, which is lower than the voltage V4, and the current I1 flows out from the output terminal of the operational amplifier 20 to the capacitor C2, the capacitor C1, the switch SW7, the switch SW3P, and the terminal V3, charging the capacitor C2 and raising the output voltage $V_{OUT}$.

Once the electrical charge at the capacitor C1 stabilizes at time T19, the variation of the voltages at the positive and the negative input terminals of the operational amplifier 20 are kept within the approximately same range, even if the voltages V1 to V4 go down simultaneously due to the increase of a processing load, for example, because the switch SW7 is ON. Thus, the output voltage $V_{OUT}$ also does not change.

At time T20, the switch control circuit 35 turns OFF the switches SW4M, SW3P, and SW7. At this time, the output voltage $V_{OUT}$ is $V_{OUT} = V_{REF1} + V_{BV4} \cdot C1/C2$. When the switch control circuit 35 sets the signal CHG to the level H at the time T20, the P-channel MOSFET 75 is turned OFF, and the constant current I4 flows out from the P-channel MOSFET 74 to the capacitor C2, and the output terminal of the operational amplifier 20. By way of this constant current I4, the electrical charge accumulated at the capacitor C2 is discharged at a constant rate, bringing down the output voltage $V_{OUT}$ at the constant rate. When the signal CHG is set to the level H, the counter 82 also starts counting the clock signal CLK.

Subsequently at time T21, the output voltage $V_{OUT}$ drops to 0.7 volts, which is the level of the reference voltage $V_{REF2}$ and applied to the negative input terminal of the comparator 80, the signal CMP output from the comparator 80 is switched to the level L, and the counter 82 stops counting the clock signal CLK. The time $T_{BV4}$, counted by the counter 82 between the time T20 and T21, corresponds to the voltage $V_{BV4}$. In other words, assuming the inclination of the output voltage $V_{OUT}$ between the time T20 to the time T21 counted by the counter 82 is $-1/K$, $T_{BV4}=K\cdot(V_{REF1}+V_{BV4}\cdot C1/C2-V_{REF2})=K\cdot(V_{BV4}\cdot C1/C2+0.1)$.

The microcomputer 45 can calculate the voltage $V_{BV4}$ of the battery BV4 from the $T_{REF3}$ and $T_{BV4}$ measured by the counter 82. More specifically, $V_{BV4}=(C2/C1)\cdot(T_{BV4}-T_{REF3})/K+V_{REF3}$. By calculating voltage $V_{BV4}$ by comparing the count $T_{REF3}$, counted with the reference voltage $V_{REF3}$, and the count $T_{BV4}$, counted with the voltage $V_{BV4}$ of the battery BV4, the battery voltage can be detected more accurately. For example, if the clock signal CLK is generated by a less accurate circuit such as an RC resonant circuit, and the voltage of $V_{BV4}$ of the battery BV4 is calculated based only on the $T_{BV4}$ measured by the counter 82, the detected voltage $V_{BV4}$ becomes less accurate, for example, due to change in the clock frequency caused by temperature variation. By comparing with the count $T_{REF3}$ counted with the given reference voltage $V_{REF3}$, as explained for the fourth embodiment, an effect of the clock frequency variation can be cancelled out, allowing more accurate detection of the voltage $V_{BV4}$ of the battery BV4.

At time T22 and thereafter, the voltages $V_{BV1}$ to $V_{BV3}$ of the batteries BV1 to BV3 can be also detected by controlling the switches SW0P to SW3P, SW5P, SW6P, SW1M to SW6M and SW7 in the same manner as in the third embodiment, and discharging the capacitor C2 at a constant rate by way of the current I4, in the same manner as described above.

The embodiments of the present invention are explained the above. As described, in the battery voltage detection circuits 10A to 10D, the capacitors C1 to C4 are used instead of resistors to provide the differential amplification with the operational amplifier 20. Because the operational amplifier 20 is not applied with the direct current from the batteries BV1 to BV4, the operational amplifier 20 does not have to be tolerable against a high voltage. Also because the output voltage $V_{OUT}$ can be raised by adjusting the capacitance ratio of the capacitors C1 to C4, the AD converter does not have to be highly accurate. Therefore, the battery voltage can be detected accurately with a low cost.

Figure 18:
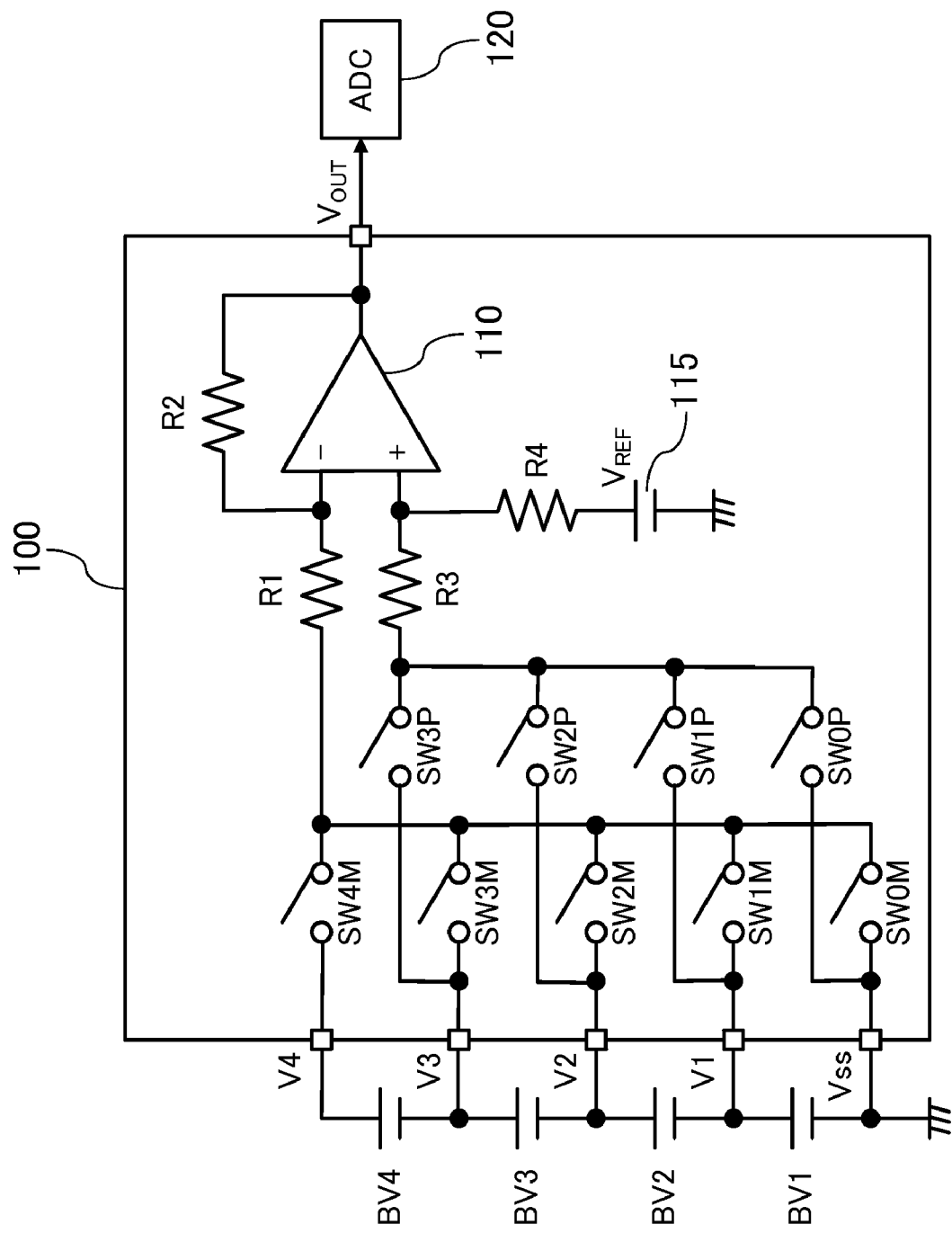
FIG. 18 is a diagram that shows a structure of a common battery voltage detecting circuit.

Furthermore, the electrical charge discharged from the batteries can be reduced, compared with the provision of a differential amplification using the resistors. For example, in the battery voltage detecting circuit 100 of FIG. 18, assuming that the resistors R1 and R3 are 5 mega ohms, the voltage $V_{BV4}$ of the battery BV4 is 5 volts, and the conversion time at the ADC 120 is 30 milliseconds, then the electrical charge Q discharged upon detecting the voltage $V_{BV4}$ will be Q=IT=5V/10 MΩ×30 ms=15 μC. On the contrary, in the battery voltage detecting circuits 10A to 10D, assuming that the capacitance of the capacitor C1 is 2 pF, each of the voltages $V_{BV1}$ to $V_{BV4}$ of the batteries BV1 to BV4 are 5 volts, then the electrical charge Q discharged upon turning the SW4 ON will be Q=CV=2 pF×20V=40 pC=0.000040 μC. This is much smaller than the battery voltage detecting circuit 100. Also in the battery voltage detecting circuit 100, the electrical charge is kept being discharged as long as the switches SW4M and SW3P are ON, even after the conversion time at the ADC 120 has elapsed. On the contrary, in the battery voltage detecting circuits 10A to 10D, the electrical charge is not discharged after the capacitor C1 is charged. Therefore, the battery voltage detecting circuits 10A to 10D can prevent the batteries from being consumed by detecting operation of the voltages therein.

Furthermore, because the capacitor C5 is provided in the battery voltage detecting circuits 10A to 10D, the voltage $V^-$ at the negative input terminal of the operational amplifier 20 drops by a smaller degree, thus suppresses current generation at the parasitic diode 60. This makes the detection accuracy of the battery voltages less deteriorated. Even though, the descent amount of the voltage $V^-$ increases corresponding to the amplifying gain C1/C2 at the operational amplifier 20, it is possible to decrease the descent amount of the voltage $V^-$ by increasing the capacitance of the capacitor C5. This enables to increase the amplifying gain C1/C2. In other words, the output voltage $V_{OUT}$ can be raised by increasing the amplifying gain C1/C2, and the accuracy of the battery voltage detection can be improved.

Still furthermore, the battery voltage detecting circuits 10B and 10D detect the battery voltages by discharging the electrical charge accumulated at the capacitor C2 with the constant current I4. In other words, the capacitor C2 is also used as a part of the AD converter in the battery voltage detecting circuit 10B and 10D. In this manner, for example, the capacitor 52, required for the ADC 40 shown in FIG. 3, is no longer necessitated, which allows further cost reduction. Moreover, in the ADC 40, when the capacitor 52 is charged and the voltage is raised, an error can occur in a constant current output from the current source 51 due to variation in the voltage at both ends of the current source 51. On the contrary, in the battery voltage detecting circuits 10B and 10D, the voltage at the other end of the capacitor C2 (at the negative input terminal of the operational amplifier 20) does not change. Therefore, no error occurs in the constant current I4 while the discharging takes place, which allows highly accurate detections of the battery voltages.

Still furthermore, the battery voltage detecting circuits 10B and 10D, the voltages $V_{BV1}$ to $V_{BV4}$ are detected by comparing the time measured for the voltages $V_{BV1}$ to $V_{BV4}$ of the batteries BV1 to BV4 with the time measured for the reference voltage $V_{REF3}$. Therefore, even if the clock cycle changes, for example, due to temperature variation, the voltages $V_{BV1}$ to $V_{BV4}$ can be detected at a high accuracy. This arrangement enables a low-cost resonant circuit, such as RC resonant circuit to be adopted, allowing highly accurate detections of the battery voltages at a reduced cost.

Still furthermore, in the battery voltage detecting circuits 10A to 10D, the capacitor C1 can be implemented using a wiring capacitance. Because a wiring capacitance is generally less voltage-dependent than the other capacitors, the battery voltages can be detected more accurately. Unlike a circuit provided with a large resistance value and less voltage-dependency resistors, the existing production process can be utilized as they are. This enables to suppress cost increase.

Still furthermore, in the battery voltage detecting circuits 10A to 10D, the capacitors C1 and C2 are implemented using wiring capacitances and the capacitor C5 is formed using the dummy metal to improve the precision of the capacitances of the capacitors C1 and C2. The capacitor C5 is provided to prevent the voltage $V^-$ from dropping. Therefore, the accuracy of the capacitance of the capacitor C5 does not affect the detection accuracy of the battery voltages. Therefore, by providing the capacitor C5 with the dummy metal, the dummy metal can be better utilized. In addition, the chip size can be reduced compared with, when a capacitor C5 is separately provided.

Still furthermore, in the battery voltage detecting circuits 10A and 10B, the voltages $V_{BV1}$ to $V_{BV4}$, respectively of the batteries BV1 to BV4 connected serially, are effectively detected by switching the switches SW0 to SW4 to ON sequentially from the one with the highest potential to the one with the lowest potential. The voltages $V_{BV1}$ to $V_{BV4}$ of the batteries BV1 to BV4 can also be effectively detected by switching the switches SW0 to SW4 to ON sequentially from the one with the lowest potential to the one with the highest potential.

Still furthermore, in the battery voltage detecting circuits 10A and 10B, after the switches SW0 to SW4 are turned ON sequentially from the one with the highest potential to the one with the lowest potential, the switches SW1 to SW3 are turned ON sequentially from the one with the lowest potential to the one with the highest potential. As shown in FIG. 5, this switching allows the charge incoming by the current I1 to be cancelled out by the charge outgoing by the current I2. In this manner, variation of the battery voltages, which occur when the battery voltages are detected repeatedly, can be suppressed.

Still furthermore, in the battery voltage detecting circuits 10C and 10D, the variation of the voltages at the positive and the negative input terminals of the operational amplifier 20 are kept almost the same, even if the voltages V1 to V4 go down simultaneously due to the increase of a processing load, for example, because the switch SW7 is turned ON. This makes the output voltage $V_{OUT}$ to detect of the battery voltages with high accuracy, yet without change.

Still furthermore, in the battery voltage detecting circuits 10C and 10D, the voltages $V_{BV1}$ to $V_{BV4}$ of the batteries BV1 to BV4 are effectively detected by applying the voltage to the capacitors C1 and C3 from each of the serially connected batteries BV1 to BV4, sequentially from the one with the highest potential to the one with the lowest potential. In the similar manner, the voltages $V_{BV1}$ to $V_{BV4}$ of the batteries BV1 to BV4 can also be detected efficiently by applying the voltage to the capacitors C1 and C3 from each of the batteries BV1 to BV4, sequentially from the one with the lowest potential to the one with the highest potential.

Still furthermore, in the battery voltage detecting circuits 10C and 10D, after the voltage is applied to the capacitors C1 and C3 sequentially from the one with the highest potential to the one with the lowest potential, the voltage is applied to the capacitor C1 and C3 sequentially from the one with the lowest potential to the one with the highest potential. Therefore, the electrical charge incoming by the currents I1 and I2 can be cancelled out. In this manner, variation of the battery voltages, which occur when the battery voltages are detected repeatedly, can be suppressed.

The above embodiments of the present invention are simply for facilitating the understanding of the present invention and are not in any way to be construed as limiting the present invention. The present invention may variously be changed or altered without departing from its spirit and encompass equivalents thereof.

Figure 14:
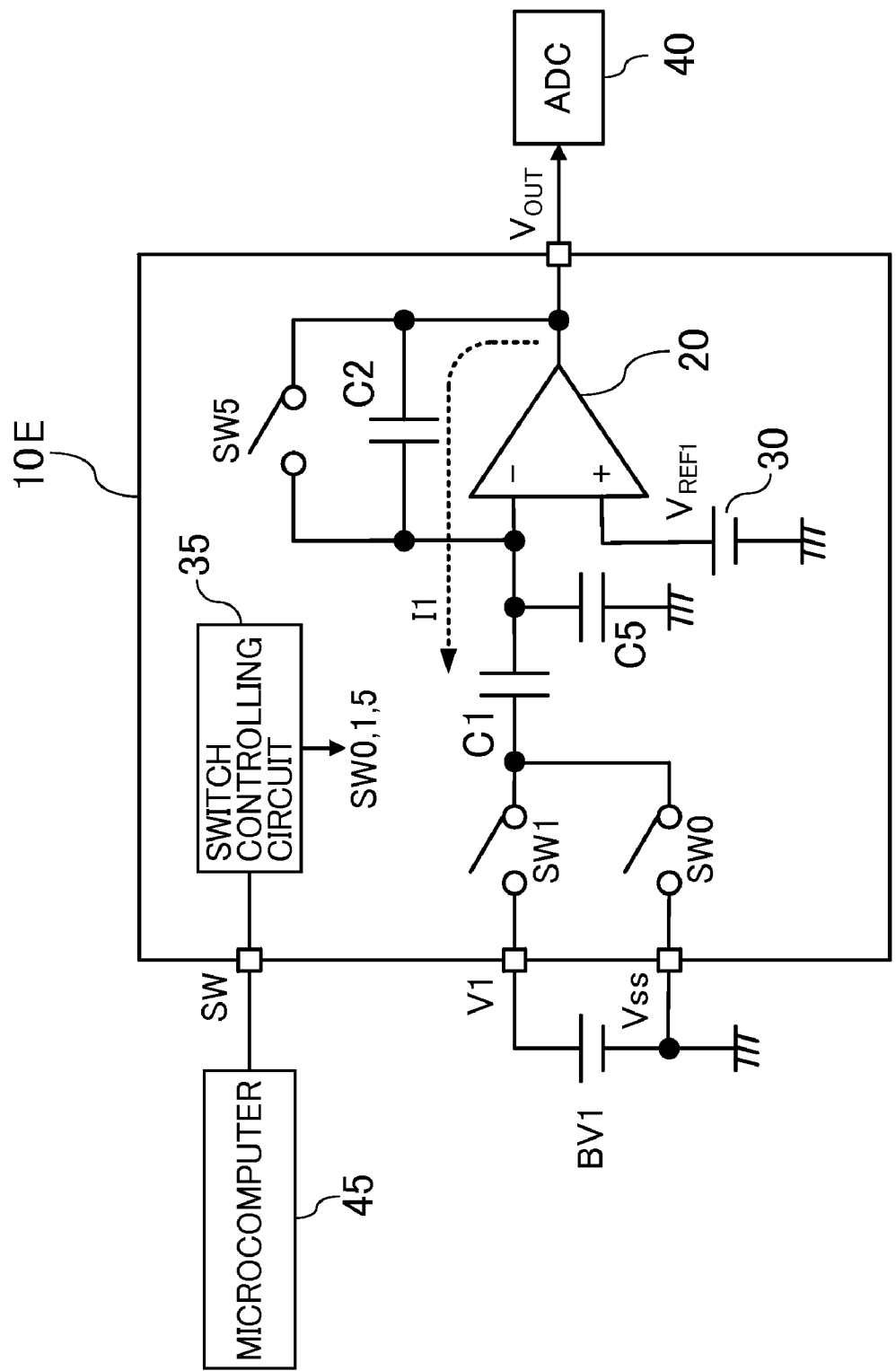
FIG. 14 is a diagram that shows another circuit structure of a battery voltage detecting circuit.

In the battery voltage detecting circuits 10A to 10D, the voltages of the serially connected batteries BV1 to BV4 are detected as an example. However, since the number of the batteries is not limited to a plurality, it is possible to comprise a battery voltage detecting circuits 10E that is able to detect a voltage of the single battery BV1 as shown in FIG. 14.

Furthermore, the battery voltage detecting circuits 10A to 10E are explained to detect the voltages of the batteries. However, the detected voltages are not limited to those of batteries, and the present invention can be also applied to a voltage detecting circuit that detects any type of voltages.

Figure 15:
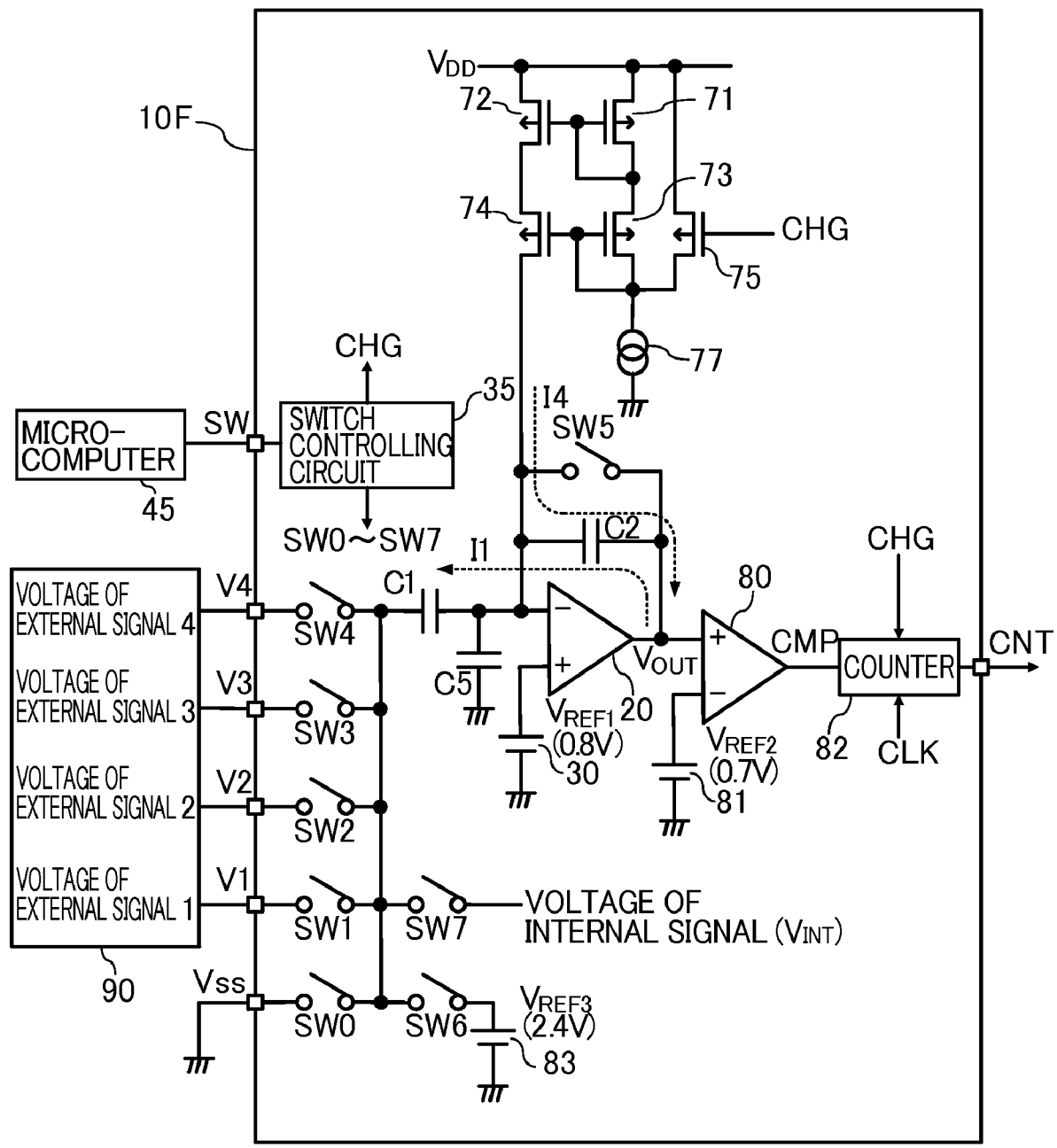
FIG. 15 is a diagram that shows a circuit structure of a voltage detecting circuit for detecting voltages of external signals and internal signals.
Figure 16:
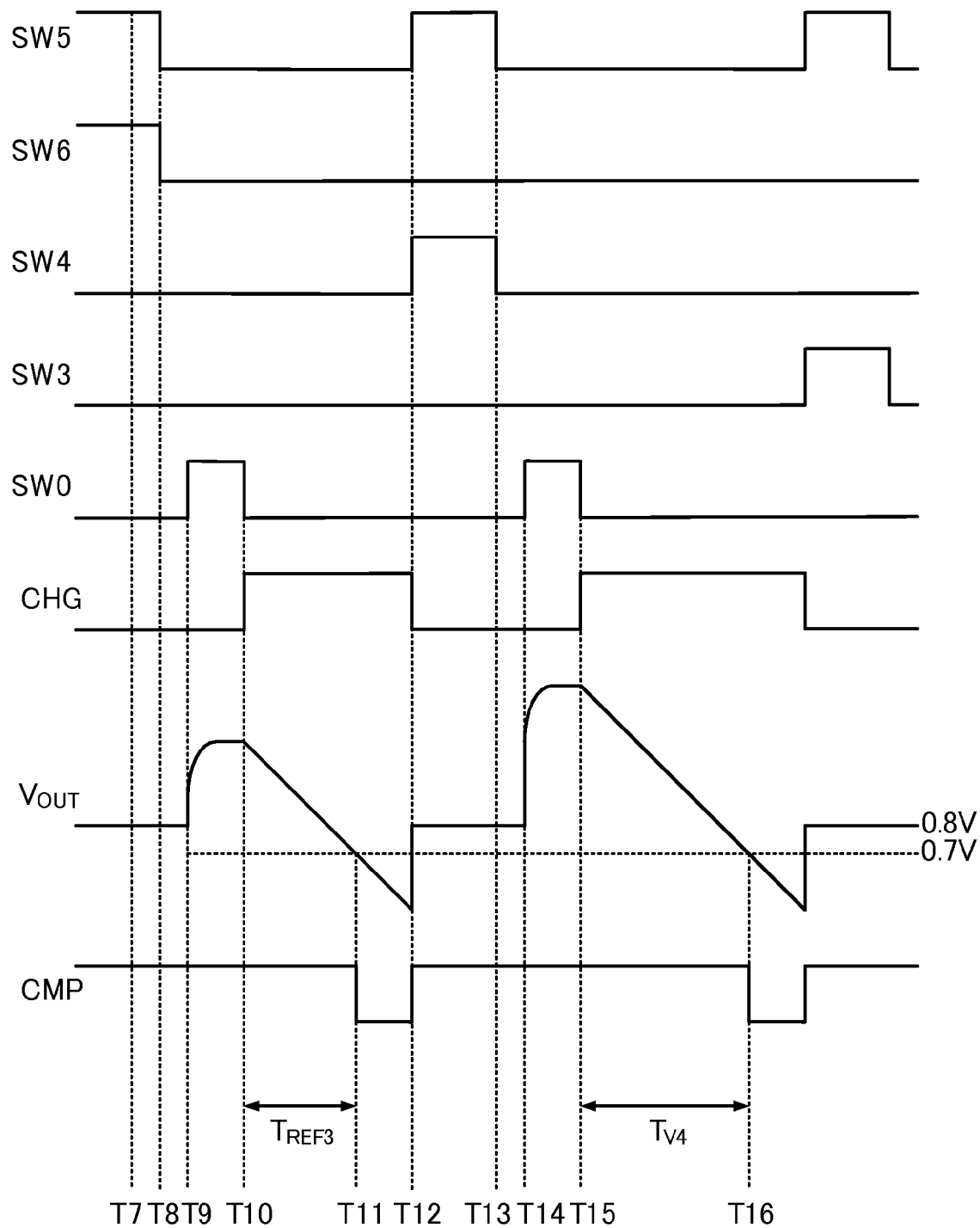
FIG. 16 is a timing chart that shows an example of an operation of the voltage detecting circuit shown in FIG. 15.

For example, a detecting circuit 10F shown in FIG. 15 further includes a switch SW7, in addition to the battery voltage detecting circuit 10B shown in FIG. 8. The voltage detecting circuit 10F can detect voltages 1 to 4 of external signals (the first voltages) output from an large scale integration (LSI) 90 arranged external to the voltage detecting circuit 10F, or voltages $V_{INT}$ (the first voltage) of an internal signal, generated inside the voltage detecting circuit 10F, base on a voltage $V_{SS}$ (a second voltage), which is at the ground level. Assuming that the LSI 90 is a driving circuit for four motors, each of the external signal voltages 1 to 4 corresponds to the rotation speed of each motor. For example, the internal signal voltage $V_{INT}$ changes depending on the temperature characteristics of a forward voltage of a diode in the voltage detection circuit 10F, and is used for detecting the temperature of the voltage detecting circuit 10F. FIG. 16 is a timing chart that shows an example of the operation of the voltage detecting circuit 10F. The operations at time T7 to T13 are same as those of the battery voltage detecting circuit 10B as shown in FIG. 9. After the external signal voltage 4 (V4) is applied to the capacitor C1 between time T12 and T13, the switch SW0 is turned ON at time T14. By way of this switching, the ground voltage $V_{SS}$ is applied to the capacitor C1, and the output voltage $V_{OUT}$ shifts to the level of the external signal voltage 4 (V4) based on the ground level $V_{SS}$. By measuring the time $T_{V4}$ between the time T15 and T16 using the counter 82, the voltage of the external signal voltage 4 (V4) based on the ground level $V_{SS}$, can be detected. In the similar manner, the external signal voltages 1 to 3 (V1 to V3) and the internal signal voltage $V_{INT}$ can also be detected based on the ground level $V_{SS}$.

Figure 17:
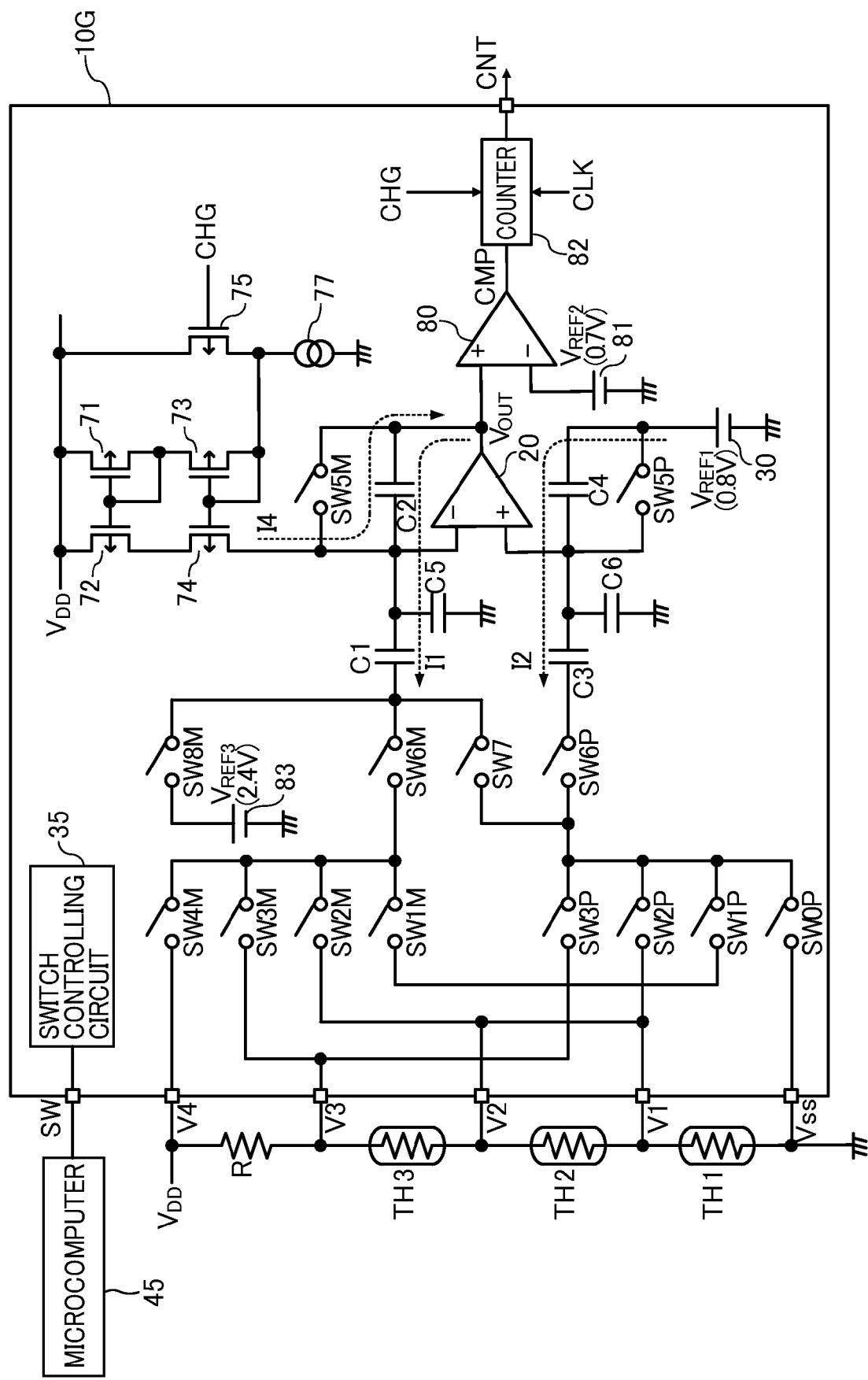
FIG. 17 is a diagram that shows a voltage detecting circuit for detecting voltages of thermistors.

Another example, a voltage detecting circuit 10G shown in FIG. 17, has the same structure as the battery voltage detecting circuit 10D shown in FIG. 12. The voltage detecting circuit 10G has a thermistor TH1 connected between the terminals $V_{SS}$ and V1, a thermistor TH2 connected between the terminals V1 and V2, a thermistor TH3 connected between the terminals V2 and V3, a resistor R connected between the terminals V3 and V4, and the power source voltage $V_{DD}$ applied to the terminal V4. In the voltage detecting circuit 10G having such a structure can detect the voltage between (difference between the voltages at) both ends of each of the thermistor TH1 to TH3, and the resistor R.

It is claimed:

1. A voltage detecting circuit comprising:
   an operational amplifier whose one input terminal is configured to be applied with a first reference voltage;
   a first capacitor whose one end is connected to the other input terminal of the operational amplifier;
   a second capacitor whose one end is connected to an output terminal of the operational amplifier, and whose other end is connected to the other input terminal of the operational amplifier;
   a switch circuit configured to apply a first voltage and a second voltage sequentially to the other end of the first capacitor; and
   a discharging circuit configured to discharge the second capacitor before the second voltage is applied to the other end of the first capacitor,
   a difference between the first voltage and the second voltage being detected based on a voltage at the output terminal of the operational amplifier after the second voltage is applied to the other end of the first capacitor.

2. The voltage detecting circuit according to claim 1, further comprising a third capacitor whose one end is connected to the other input terminal of the operational amplifier, and whose other end is configured to be grounded.

3. The voltage detecting circuit according to claim 1, further comprising:
   a constant current outputting circuit configured to output a constant current to discharge electrical charge accumulated at the second capacitor at a constant rate in response to an input discharge initiating signal;

a comparing circuit configured to output a result of comparison between a voltage at the output terminal of the operational amplifier and a second reference voltage; and a counting circuit configured to start counting in response to the discharge initiating signal, and to stop counting when the voltage at the output terminal of the operation amplifier is determined to have reached the level of the second reference voltage based on the result of comparison output from the comparing circuit.

4. The voltage detecting circuit according to claim 3, wherein the switch circuit is further configured to apply a third reference voltage to the other end of the first capacitor.

5. The voltage detecting circuit according to claim 1, wherein:
the voltage detecting circuit includes an integrated circuit; and
the first capacitor includes a wiring capacitance constituted by a wiring in the integrated circuit.

6. The voltage detecting circuit according to claim 2, wherein:
the voltage detecting circuit includes an integrated circuit;
the first and the second capacitors include wiring capacitances constituted by wirings in the integrated circuit; and
the third capacitor includes a dummy wring configured to improve the accuracy of capacitances of the first and the second capacitors.

7. The voltage detecting circuit according to claim 1, wherein
the switch circuit is further configured to apply a voltage at one of terminals of a first and a second batteries, which are connected serially to each other, to the other end of the first capacitor, and wherein
the voltage detecting circuit further comprises
a switch control circuit configured to control the discharging circuit and the switch circuit so as to:
discharge the second capacitor, apply a voltage at one terminal of the first battery to the first capacitor, and apply a voltage at one terminal of the second battery to the first capacitor, sequentially; and thereafter
discharge the second capacitor, and apply a voltage at the other terminal of the second battery to the first capacitor, sequentially.

8. The voltage detecting circuit according to claim 7, wherein
the switch control circuit is further configured to control the switch circuit so as to apply the voltage at the other terminal of the second battery to the first capacitor, and thereafter apply the voltage at the one terminal of the second battery to the first capacitor.

9. The voltage detecting circuit according to claim 1, further comprising:
a third capacitor whose one end is connected to the one input terminal of the operational amplifier; and
a fourth capacitor whose one end is configured to be applied with the first reference voltage, and whose other end is connected to the one input terminal of the operational amplifier, wherein
the switch circuit is further configured to apply the second voltage to the other ends of the first and the third capacitors, respectively, after applying the first voltage to the other end of the first capacitor, and the second voltage to the other end of the third capacitor, and wherein the discharging circuit is further configured to discharge the second and the fourth capacitors before the second voltage is applied to the other ends of the first and the third capacitors, respectively, and wherein
the difference between the first voltage and the second voltage is to be detected based on the voltage at the output terminal of the operational amplifier after the second voltage is applied to the other ends of the first and the third capacitors, respectively.

10. The voltage detecting circuit according to claim 9, further comprising:
a terminal configured to be applied with the first voltage; and
a terminal configured to be applied with the second voltage.

11. The voltage detecting circuit according to claim 9, further comprising:
a fifth capacitor whose one end is connected to the other input terminal of the operational amplifier, and whose other end is configured to be grounded.

12. The voltage detecting circuit according to claim 9, wherein:
the voltage detecting circuit includes an integrated circuit; and
the first and the third capacitors include wiring capacitances constituted by wirings in the integrated circuit.

13. The voltage detecting circuit according to claim 11, wherein:
the first to the fourth capacitors include wiring capacitances constituted by wirings in the integrated circuit; and
the fifth capacitor includes a dummy wring configured to improve the accuracy of the capacitances of the first to the fourth capacitors.

14. The voltage detecting circuit according to claim 9, wherein
the switch circuit is further configured to apply a voltage at one of terminals of a first and a second batteries, which are connected serially to each other, to the other ends of the first and the third capacitors, and wherein
the voltage detecting circuit further comprises a switch control circuit configured to control the discharging circuit and the switch circuit so as to:
discharge the second and the fourth capacitors, apply a voltage at one end of the first battery to the first capacitor, apply a voltage at the other terminal of the first battery to the third capacitor, and apply the voltage at the other terminal of the first battery to the first and the third capacitors, sequentially; and thereafter
discharge the second and the fourth capacitors, apply a voltage at one terminal of the second battery to the first capacitor, apply a voltage at the other terminal of the second battery to the third capacitor, and apply the voltage at the other terminal of the second battery to the first and the third capacitors, sequentially.

15. The voltage detecting circuit according to claim 14, wherein
the switch control circuit is further configured to control the switch circuit so as to apply the voltage at the other terminal of the second battery to the first and the third capacitors, and thereafter apply the voltage at the one terminal of the second battery to the first and the third capacitors sequentially.

* * * * *